United States Patent
Imamura et al.

(10) Patent No.: US 7,345,888 B2
(45) Date of Patent: Mar. 18, 2008

(54) COMPONENT BUILT-IN WIRING BOARD AND MANUFACTURING METHOD OF COMPONENT BUILT-IN WIRING BOARD

(75) Inventors: Tatsuro Imamura, Tokyo (JP); Yuji Yamaguchi, Tokyo (JP); Kazuhiro Shinozaki, Tokyo (JP); Satoshi Shibazaki, Tokyo (JP); Yoshitaka Fukuoka, Tokyo (JP); Hiroyuki Hirai, Fuchu (JP); Osamu Shimada, Fuchu (JP); Kenji Sasaoka, Fuchu (JP); Kenichi Matsumura, Fuchu (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 11/785,607

(22) Filed: Apr. 19, 2007

(65) Prior Publication Data

US 2007/0195511 A1 Aug. 23, 2007

Related U.S. Application Data

(62) Division of application No. 10/530,518, filed on Oct. 21, 2005, now Pat. No. 7,242,591.

(30) Foreign Application Priority Data

Oct. 8, 2002 (JP) ............................ P2002-294463
Aug. 27, 2003 (JP) ............................ P2003-302391
Aug. 27, 2003 (JP) ............................ P2003-302392

(51) Int. Cl.
  *H05K 1/18* (2006.01)
(52) U.S. Cl. ..................................................... 361/761
(58) Field of Classification Search ................. 361/760, 361/761
See application file for complete search history.

(56) References Cited

U.S. PATENT DOCUMENTS 7,133,037 B2* 11/2006 Kim et al. .................. 345/206

FOREIGN PATENT DOCUMENTS

JP 5-53269 7/1993

(Continued)

OTHER PUBLICATIONS

Imamura, et al., "Judo Buhin Naizo $B^2$ it™ Haisenban", Micro Electronics Symposium Ronbunshu, Dai 12 Kai, pp. 311-314, (Oct. 8, 2002).

(Continued)

*Primary Examiner*—Javaid H. Nasri
(74) *Attorney, Agent, or Firm*—Finnegan, Henderson, Farabow, Garrett & Dunner, L.L.P.

(57) ABSTRACT

To provide a component built-in wiring board and a manufacturing method thereof capable of further improving component mounting density without deteriorating reliability. The component built-in wiring board includes: a conductive layer (34, 35) extending in a thickness direction of the board and buried in the board without being exposed from an upper and a lower surface of the board; an electrical/electronic component (33) having a terminal and buried in the board with the terminal facing the buried conductive layer; a connecting member (36, 37) provided in a gap between the terminal of the buried electrical/electronic component and the conductive layer to electrically/mechanically connect the terminal and the conductive layer; and two upper and lower insulating layers (11, 15) which cover an outer surface of the buried electrical/electronic component excluding a portion connected to the connecting member and which are in close contact with a top and a bottom in the board thickness direction of the electrical/electronic component.

2 Claims, 17 Drawing Sheets

FOREIGN PATENT DOCUMENTS

| | | |
|---|---|---|
| JP | 06-112623 A | 4/1994 |
| JP | 09-214093 A | 8/1997 |
| JP | 2001-015920 A | 1/2001 |
| JP | 2001-053447 A | 2/2001 |
| JP | 2001-274555 A | 10/2001 |
| JP | 2001-298273 A | 10/2001 |
| JP | 2002-151846 A | 5/2002 |
| JP | 2002-319745 A | 10/2002 |
| JP | 2003-324260 A | 11/2003 |

OTHER PUBLICATIONS

Microfilm of the specification and drawings annexed to the request of Japanese Utility Model Application No. 164627/1978 (Laid-open No. 81966/1980) Hitachi Denshi, Ltd., pp. 1-7, (Jun. 5, 1980).

Notification of Transmittal of Copies of Translation of the International Preliminary Examination Report and International Preliminary Report on Patentability issued by the International Bureau of WIPO.

* cited by examiner

FIG. 3A
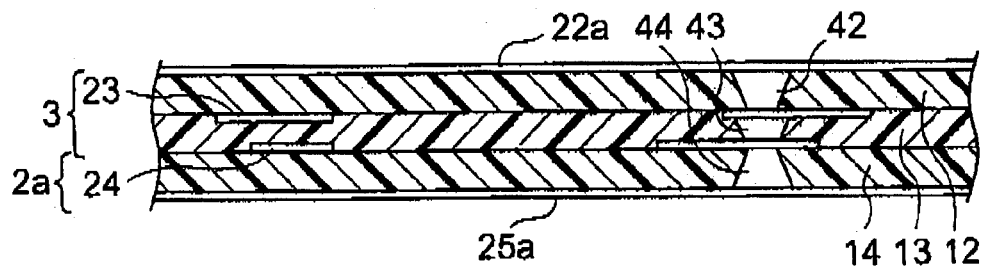
FIG. 3B1
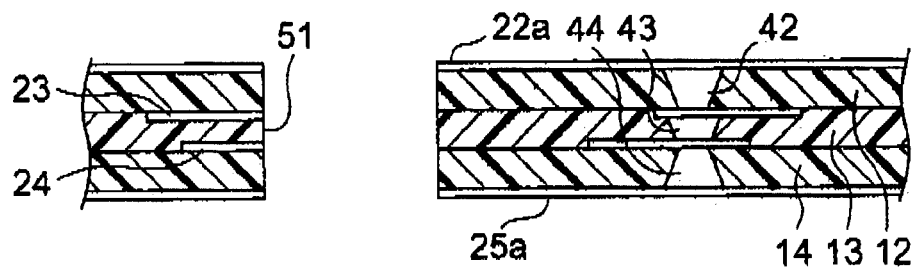
FIG. 3B2
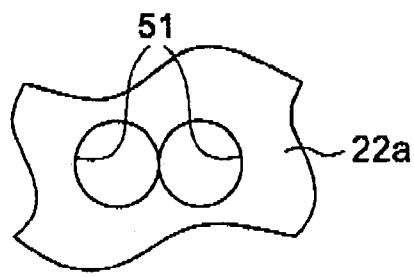
FIG. 3C1
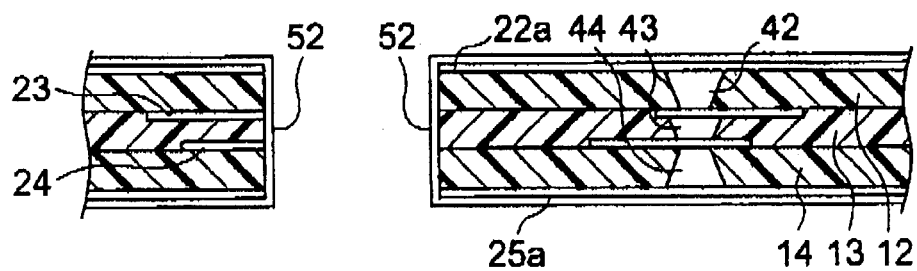
FIG. 3C2
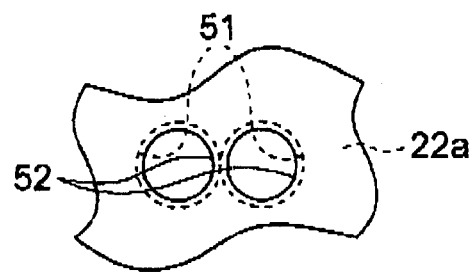

FIG. 4A1
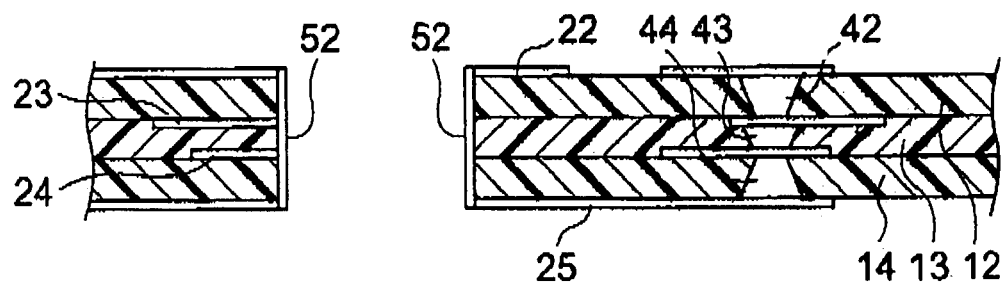
FIG. 4A2
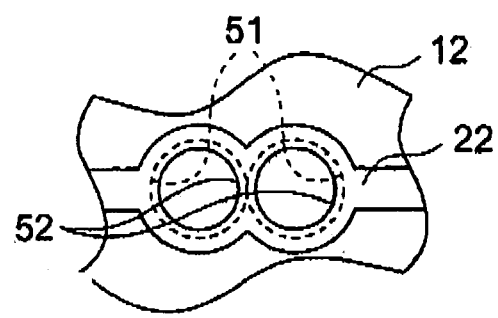
FIG. 4B
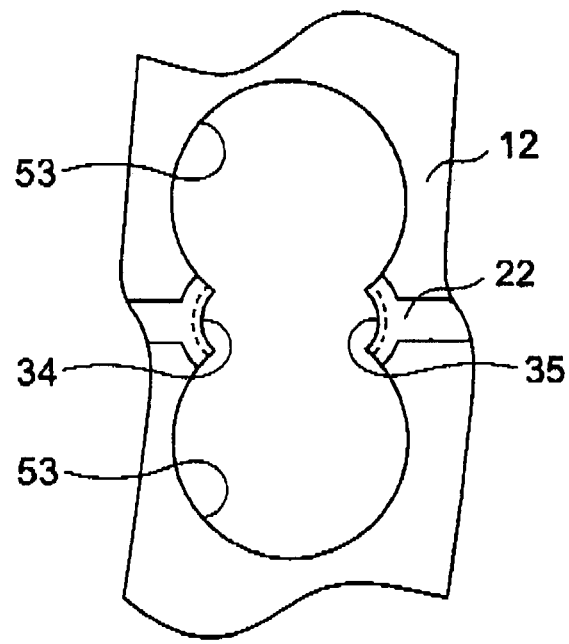

FIG. 5A
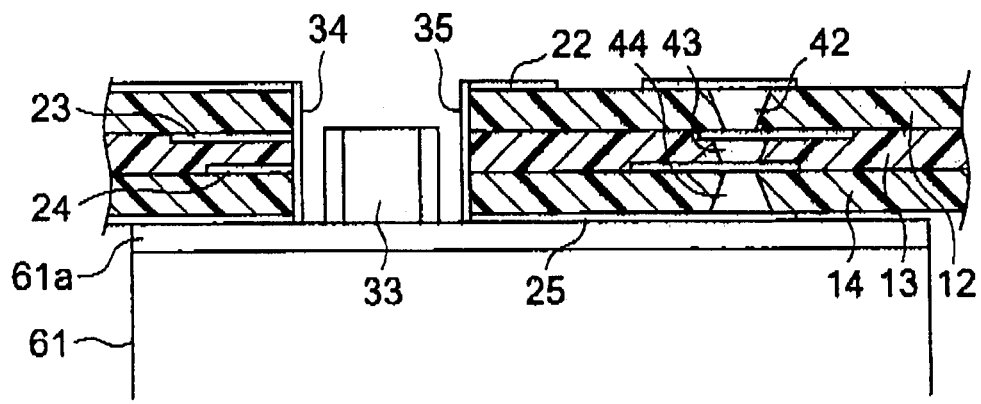
FIG. 5B1
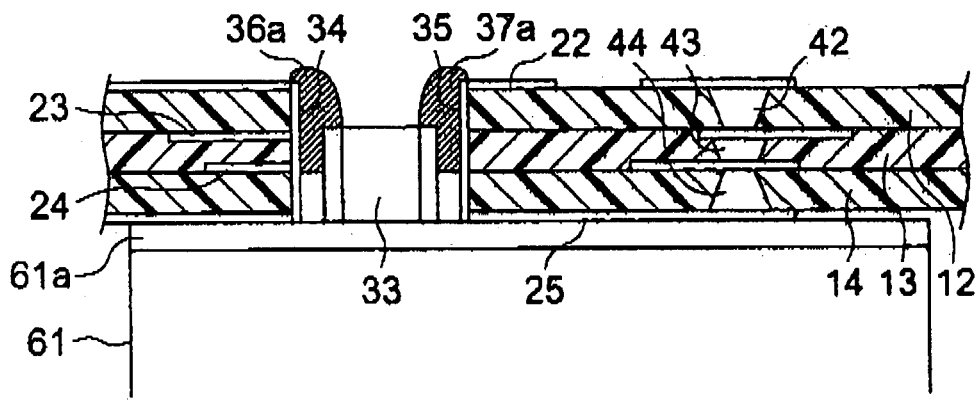
FIG. 5B2
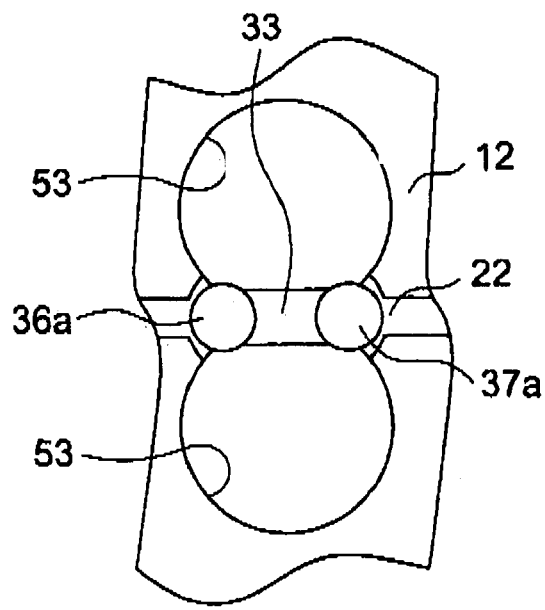

FIG. 8A
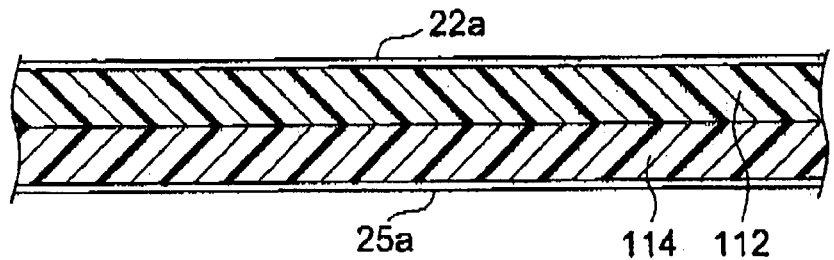
FIG. 8B1
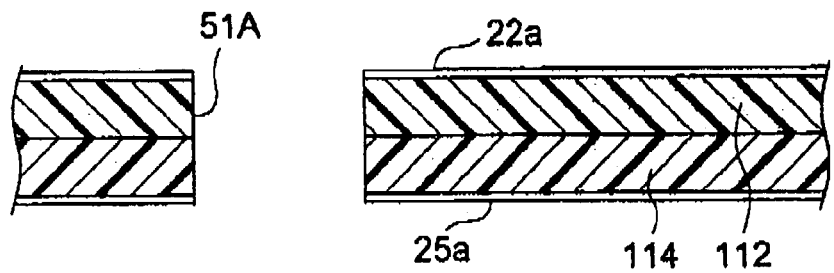
FIG. 8B2
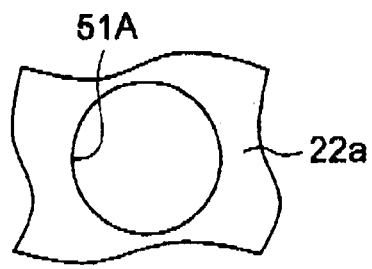
FIG. 8C1
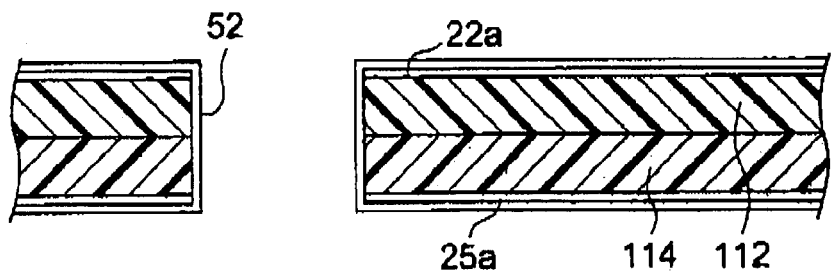
FIG. 8C2
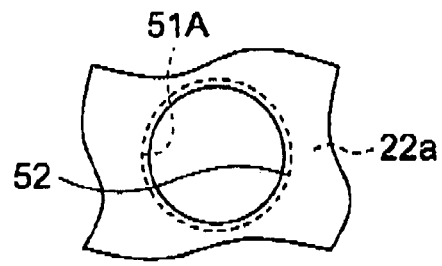

FIG. 9A1
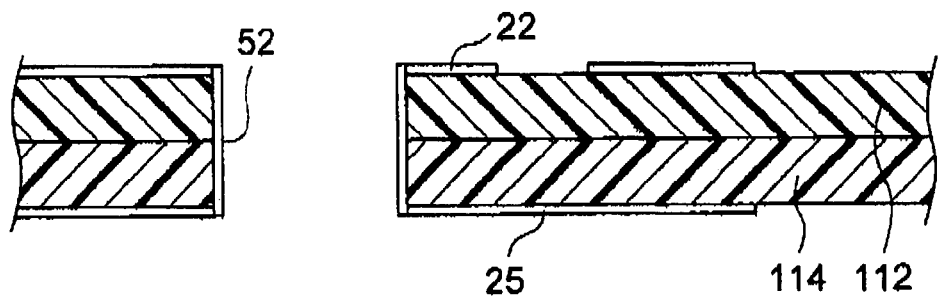
FIG. 9A2
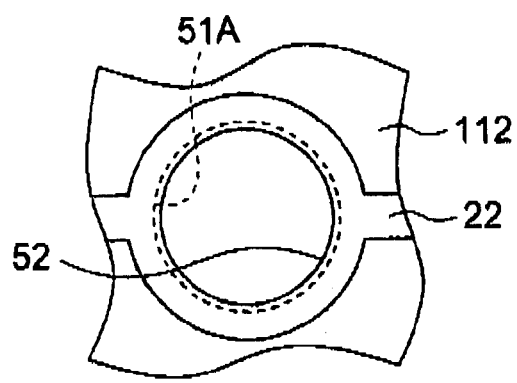
FIG. 9B1    FIG. 9B2
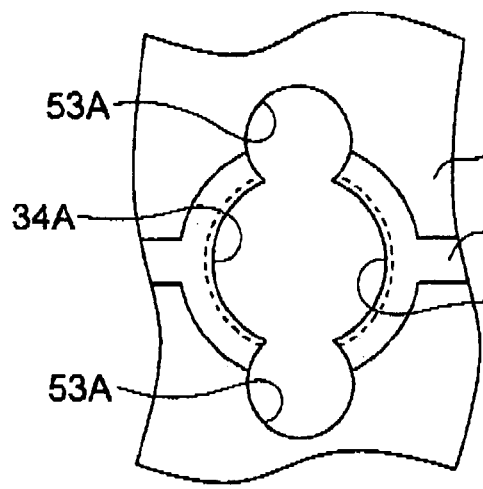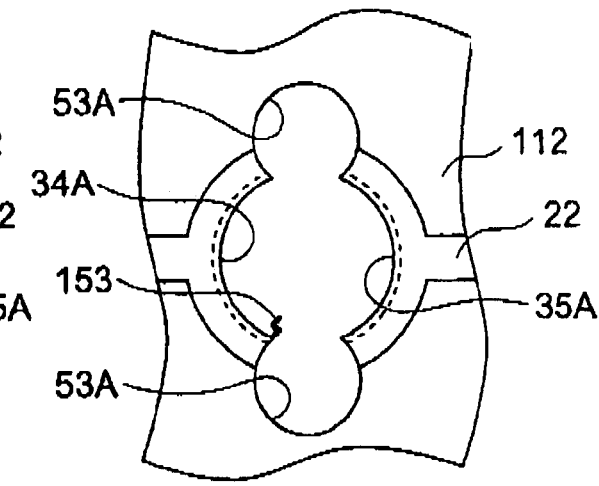

FIG. 10A
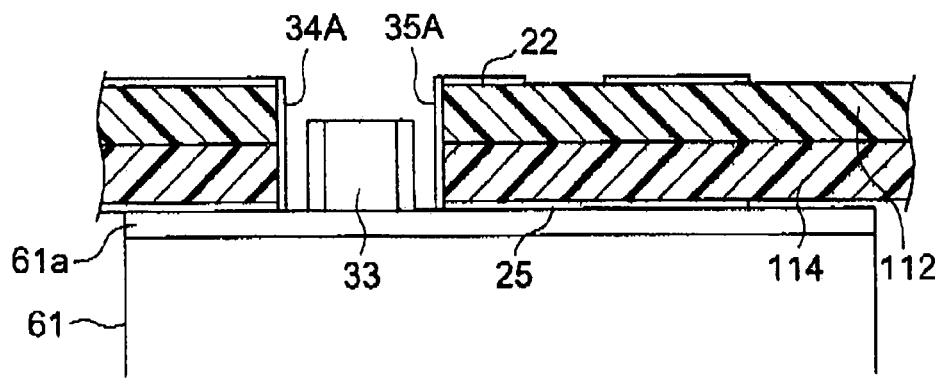
FIG. 10B1
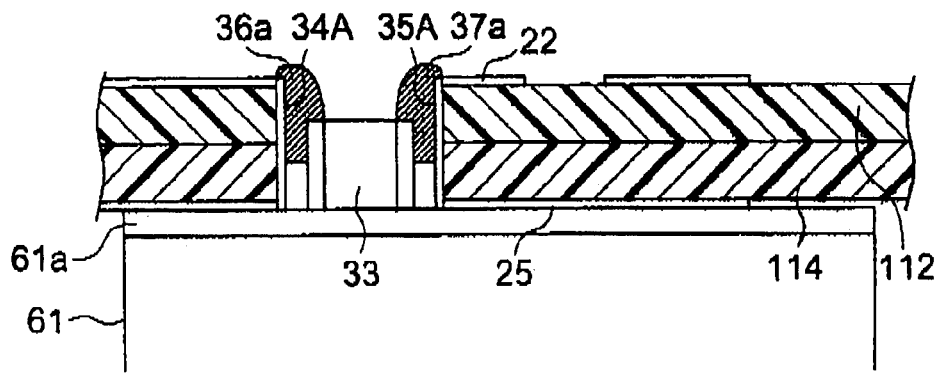
FIG. 10B2
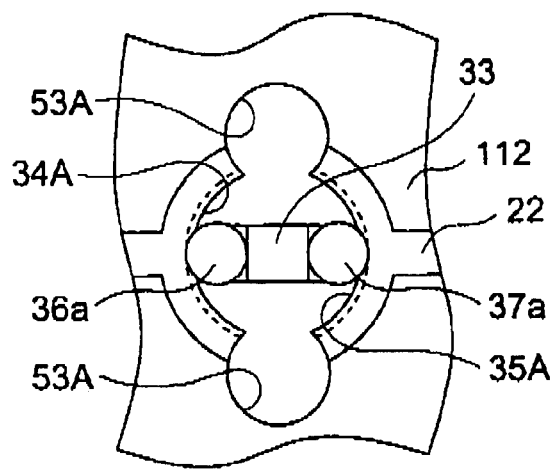
FIG. 10B3
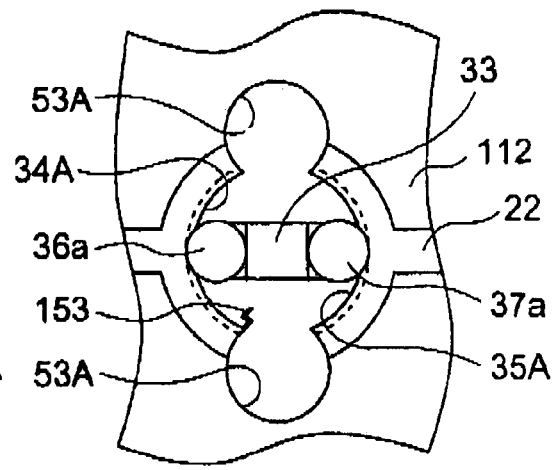

FIG. 14A
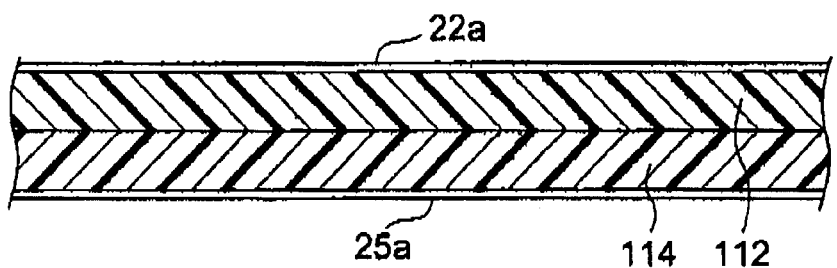
FIG. 14B1
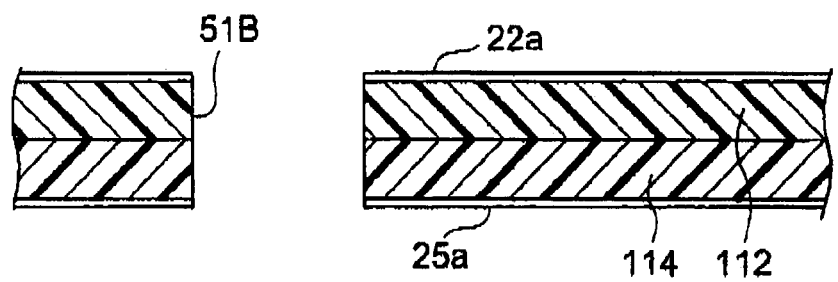
FIG. 14B2
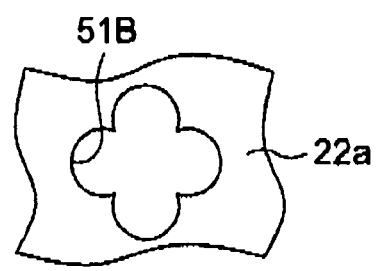
FIG. 14C1
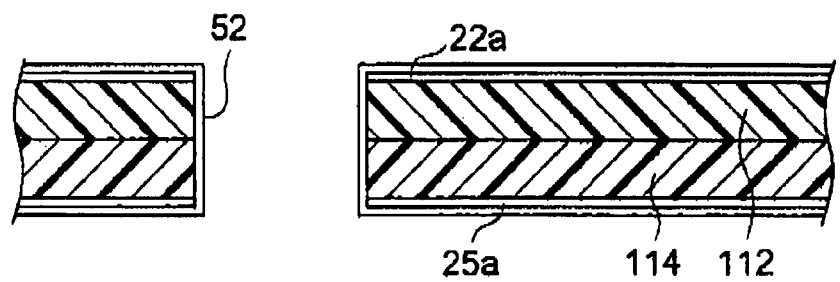
FIG. 14C2
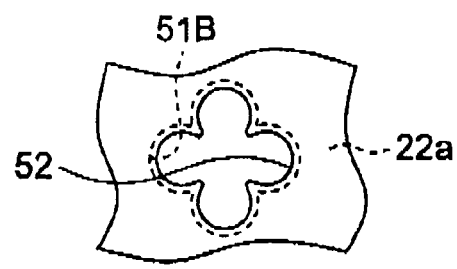

FIG. 15A1
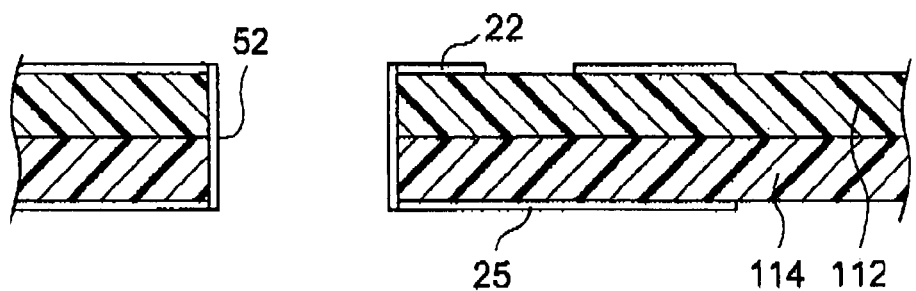
FIG. 15A2
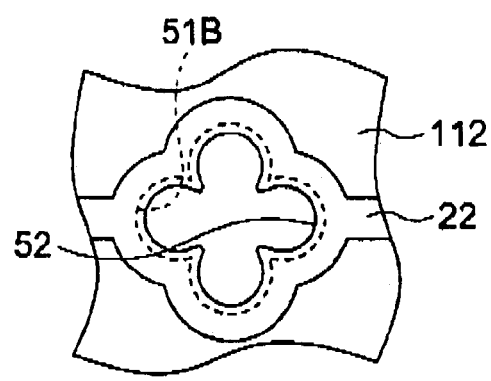
FIG. 15B1       FIG. 15B2
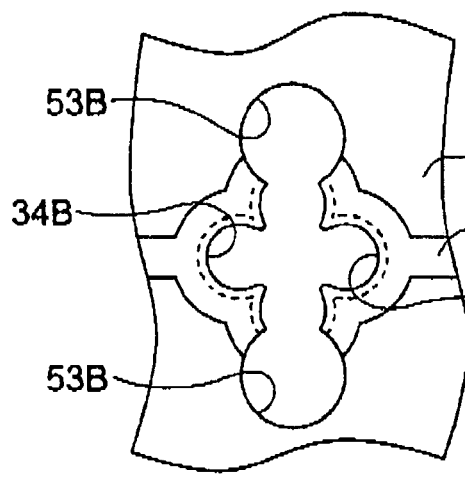 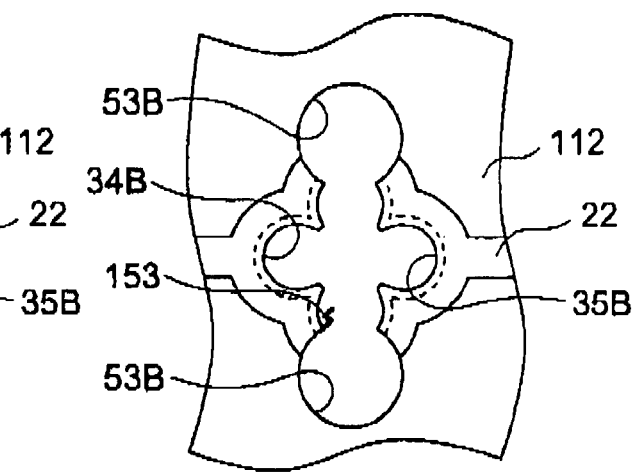

FIG. 16A
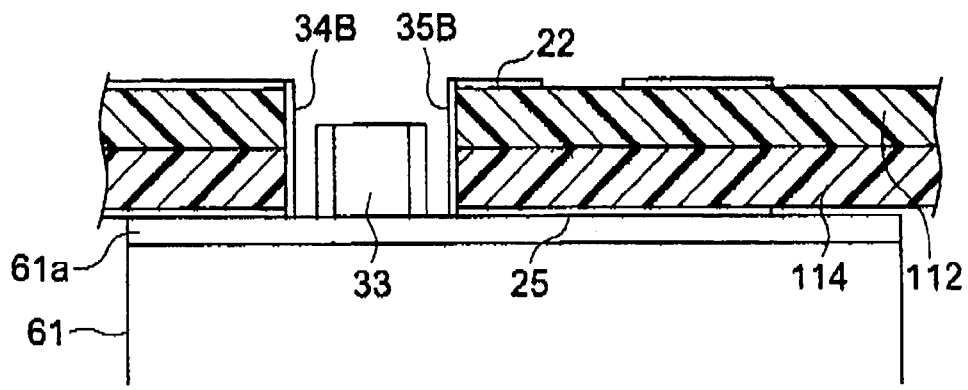
FIG. 16B1
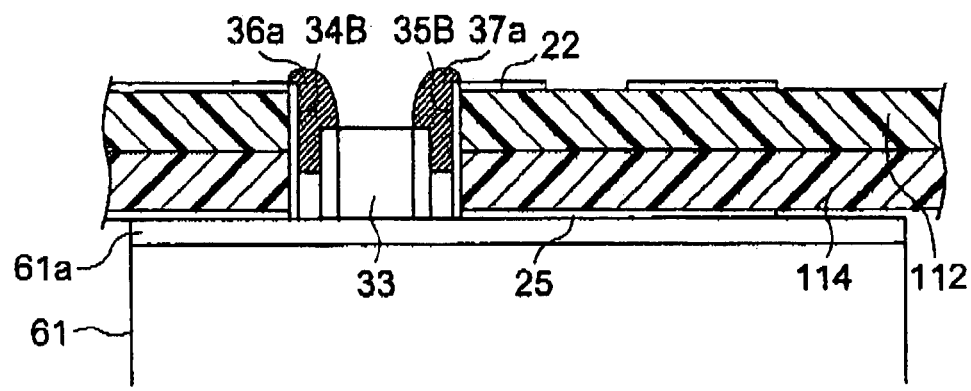
FIG. 16B2
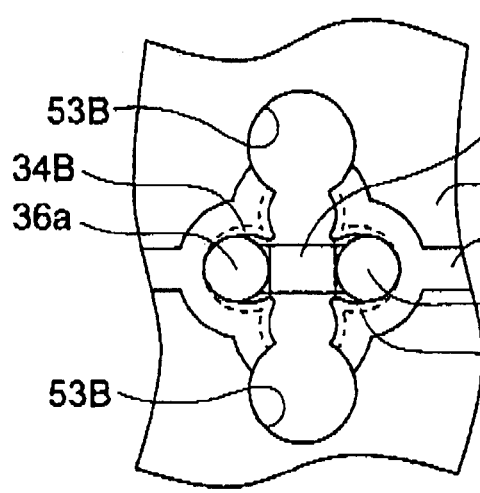
FIG. 16B3
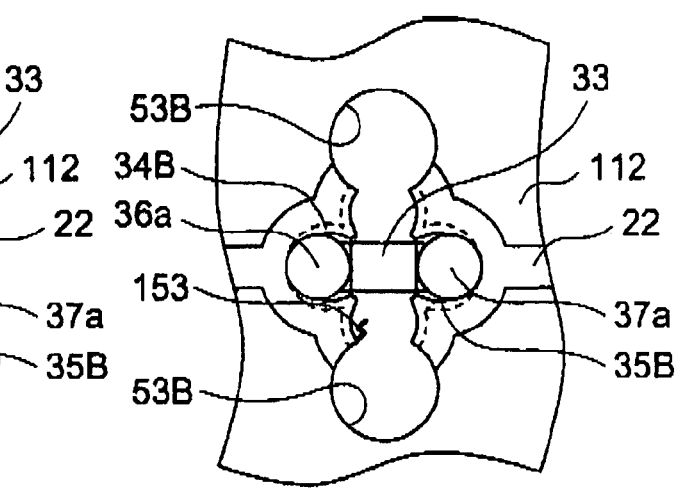

COMPONENT BUILT-IN WIRING BOARD AND MANUFACTURING METHOD OF COMPONENT BUILT-IN WIRING BOARD

This is a division of application Ser. No. 10/530,518, filed Oct. 21, 2005, now U.S. Pat. No. 7,242,591 which is incorporated herein by reference.

TECHNICAL FIELD

The present invention relates to a component built-in wiring board and a manufacturing method thereof, and more particularly, to a component built-in wiring board and a manufacturing method thereof suitable for further improving component mounting density.

BACKGROUND ART

In accordance with a recent progress of an electronics technology, electronic equipment and communication equipment are getting more highly functional and more reduced in size. Under such circumstances, as a method of mounting, for example, semiconductors on a wiring board, a bare chip mounting method instead of package mounting has come into practical use for realizing higher mounting density. Further, passive components such as a capacitor and a resistor of a chip-mounted type have been reduced in size to 0.6 mm×0.3 mm (0603).

As a method for electrical connection between wiring layers (interlayer connection) in the wiring board itself, a method of using conductive layers formed in inner surfaces of through holes is being replaced by a method in which blind vias are formed for respective layers by $CO_2$ laser or UV-YAG laser and the blind vias are plated on inner surfaces thereof or filled with conductive paste. Further, as a method of forming wiring patterns, since they are getting more microscopic, an etching method (subtractive process) is being replaced by a method of forming the wiring by metallization through plating (additive process). This has achieved microscopic formation at a level of L/S (line/space)=about 20 μm/20 μm.

For still higher component mounting density and still reduced size of equipment under such circumstances, for example, a component built-in wiring board in which a component is incorporated in a wiring board is usable. For example, Japanese Utility Model Laid-open No. Hei 5-53269 discloses such a component built-in wiring board.

DISCLOSURE OF THE INVENTION

In the component built-in wiring board disclosed in the aforesaid publication, a component incorporated inside the board is connected to lands (naturally, they are formed to extend in a direction perpendicular to a board thickness direction) provided for respective terminals of the component, as in a case where the component is mounted on the board. Here, in the structure where the component is incorporated inside the board, it is preferable that the periphery of each component excluding portions for electrical connection is closely covered with insulative resin. This is because the existence of unfilled portion would lead to deteriorated reliability. From this viewpoint, in the invention disclosed in the aforesaid publication, if there is a gap between the component and the board in which this component is directly mounted, structurally, this gap tends to be left unfilled with resin since it is extremely narrow.

The present invention was made in view of the above circumstances, and an object thereof is to provide a component built-in wiring board and a manufacturing method thereof, in particular, a component built-in wiring board and a manufacturing method thereof capable of further improving component mounting density without deteriorating reliability.

In order to solve the above problems, a component built-in wiring board according to the present invention includes: a conductive layer extending in a thickness direction of the board and buried in the board without being exposed from an upper and a lower surface of the board; an electrical/electronic component having a terminal and buried in the board with the terminal facing the buried conductive layer; a connecting member provided in a gap between the terminal of the buried electrical/electronic component and the conductive layer to electrically/mechanically connect the terminal and the conductive layer; and two upper and lower insulating layers which cover an outer surface of the buried electrical/electronic component excluding a portion connected to the connecting member and which are in close contact with a top and a bottom in the board thickness direction of the electrical/electronic component.

In this component built-in wiring board, the conductive layer connected to the terminal of the built-in component extends in the board thickness direction. Accordingly, for example, a conductive member bridged in a horizontal direction is used for the connection between the terminal of the component and the conductive layer. This is a structure in which a void does not easily occur around the built-in component, and the two upper and lower insulating layers are in close contact with the periphery of the built-in component. Consequently, no void occurs around the built-in component, resulting in no deterioration in reliability.

Further, a manufacturing method of a component built-in wiring board according to the present invention includes: producing a core wiring board having conductive layers on at least an upper and a lower surface thereof respectively; forming a through hole in the produced core wiring board; forming a conductive layer so as to include an inner surface of the formed through hole; patterning the conductive layers provided on the upper and lower surfaces; machining the produced core wiring board so as to split the conductive layer formed in the through hole according to the number of terminals of an electrical/electronic component that is to be built in and so as make a space for housing the electrical/electronic component that is to be built in; placing the electrical/electronic component in the space; connecting each of the terminals of the placed electrical/electronic component to the split conductive layer via a conductive member; and forming and stacking insulating layers respectively on the upper and lower surfaces of the core wiring board to which the electrical/electronic component is connected via the conductive member, so as to fill a vicinity of the electrical/electronic component.

In this manufacturing method, the conductive layer for connection to the terminal of the built-in component is formed in the through hole provided in the core wiring board. Then, the core wiring board is machined so that the conductive layer formed in the through hole is split according to the number of the terminals of the built-in component and so that the space for housing the electrical/electronic component that is to be built in is made. Therefore, the terminal of the component and the conductive layer can be connected via the conductive member which is, for example, bridged in a horizontal direction. This is a structure in which a void does not easily occur around the built-in component, and the insulating layers to be stacked can fill the vicinity of the built-in component and can be in close contact with the periphery of the built-in component. Therefore, it is possible to manufacture a wiring board without any void around the built-in component and thus without causing any deterioration in reliability.

Another manufacturing method of a component built-in wiring board according to the present invention includes: producing a core wiring board having conductive layers on at least an upper and a lower surface thereof respectively; forming a through hole in the produced core wiring board so as to make a space for housing an electrical/electronic component that is to be built in; forming a conductive layer so as to include an inner surface of the formed through hole; patterning the conductive layers provided on the upper and lower surfaces; splitting the conductive layer formed in the through hole according to the number of terminals of the electrical/electronic component that is to be built in; placing the electrical/electronic component in the space; connecting each of the terminals of the placed electrical/electronic component to the split conductive layer via a conductive member; and forming and stacking insulating layers respectively on the upper and lower surfaces of the core wiring board to which the electrical/electronic component is connected via the conductive member, so as to fill a vicinity of the electrical/electronic component.

In this manufacturing method, the through hole is formed in the core wiring board so that the space for housing the built-in component is made, and the conductive layer for connection to each of the terminals of the built-in component is further formed in the through hole. Then, the conductive layer formed in the through hole is split according to the number of the terminals of the built-in component. Therefore, each of the terminals of the component and the conductive layer can be connected via the conductive member which is, for example, bridged in a horizontal direction. This is a structure in which a void does not easily occur around the built-in component, and the insulating layers to be stacked can fill the vicinity of the built-in component and can be in close contact with the periphery of the built-in component. Therefore, it is possible to manufacture a wiring board without any void around the built-in component and thus without causing any deterioration in reliability.

BRIEF DESCRIPTION OF DRAWINGS

FIG. 3A, FIG. 3B1, . . . , and FIG. 3C2 are views continuing from FIG. 2A, FIG. 2B, . . . , and FIG. 2F, schematically showing, in cross-sectional view (or partial plan view), processes of manufacturing the component built-in wiring board according to the embodiment of the present invention.

FIG. 4A1, FIG. 4A2, and FIG. 4B are views continuing from FIG. 3A, FIG. 3B, . . . , and FIG. 3C2, schematically showing, in cross-sectional view (or partial plan view), processes of manufacturing the component built-in wiring board according to the embodiment of the present invention.

FIG. 5A, FIG. 5B1, and FIG. 5B2 are views continuing from FIG. 4A1, FIG. 4A2, and FIG. 4B, schematically showing, in cross-sectional view (or partial plan view), processes of manufacturing the component built-in wiring board according to the embodiment of the present invention.

FIG. 8A, FIG. 8B1, . . . , and FIG. 8C2 are views schematically showing, in cross-sectional view (or partial plan view), processes of manufacturing the component built-in wiring board according to the other embodiment of the present invention.

FIG. 9A1, FIG. 9A2, FIG. 9B1, and FIG. 9B2 are views continuing from FIG. 8A, FIG. 8B1, . . . , and FIG. 8C, schematically showing, in cross-sectional view (or partial plan view), processes of manufacturing the component built-in wiring board according to the other embodiment of the present invention.

FIG. 10A, FIG. 10B1, FIG. 10B2, and FIG. 10B3 are views continuing from FIG. 9A1, FIG. 9A2, FIG. 9B1, and FIG. 9B2, schematically showing, in cross-sectional view (or partial plan view), processes of manufacturing the component built-in wiring board according to the other embodiment of the present invention.

FIG. 14A, FIG. 14B1, . . . , and FIG. 14C2 are views schematically showing, in cross-sectional view (or partial plan view), processes of manufacturing the component built-in wiring board according to the still other embodiment of the present invention.

FIG. 15A1, FIG. 15A2, FIG. 15B1, and FIG. 15B2 are views continuing from FIG. 14A, FIG. 14B1, . . . , and FIG. 14C2, schematically showing, in cross-sectional view (or partial plan view), processes of manufacturing the component built-in wiring board according to the still other embodiment of the present invention.

FIG. 16A1, FIG. 16B1, FIG. 16B2, and FIG. 16B3 are views continuing from FIG. 15A1, FIG. 15A2, FIG. 15B1, and FIG. 15B2, schematically showing, in cross-sectional view (or partial plan view), processes of manufacturing the component built-in wiring board according to the still other embodiment of the present invention.

BEST MODE FOR CARRYING OUT THE INVENTION

Figure 1A:
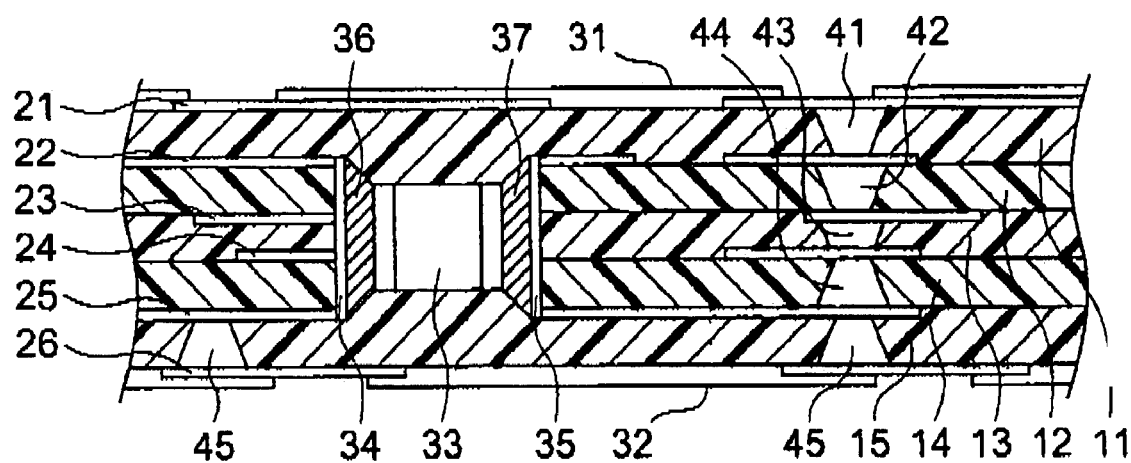
FIG. 1A and FIG. 1B are a cross-sectional view and a partial plan view schematically showing a structure of a component built-in wiring board according to one embodiment of the present invention.

According to a mode of the present invention, the electrical/electronic component is one of a semiconductor chip, a semiconductor package, a chip capacitor, a chip resistor, and a chip inductor. They are typical electrical/electronic components. Besides, discrete semiconductor elements (a transistor, a diode, and the like) are usable.

As another mode, the component built-in wiring board further includes wiring layers electrically connectable in a lateral direction to the conductive layer, the number of the wiring layers being four. The conductive layer is buried without being exposed from the upper and lower surfaces of the board as described above, and according to this mode, the four wiring layers are arranged on a lateral side of a position where the conductive layer is buried. When the number of the wiring layers is four, the thickness of that portion can be easily set to, for example, about 0.2 mm to about 0.6 mm by selecting the thickness of each insulating layer (for example, a resin layer) positioned between the wiring layers. Such dimension is equal to or slightly larger than the thickness of an electrical component such as a chip resistor, and therefore, a space for housing the component can be easily secured.

As still another mode, the wiring layers are electrically connected to one another via conductive bumps. The interlayer connection by the conductive bumps is suitable for still higher density mounting.

As yet another mode, the conductive bumps sandwich the wiring layers to be laid one over another. Laying the conductive bumps one over another with the wiring layers interposed therebetween is suitable for still higher density mounting.

As yet another mode, the component built-in wiring board further includes: two inner wiring layers provided to be in contact with inner surfaces of the two upper and lower insulating layers respectively; and two outer wiring layers provided to be in contact with outer surfaces of the two upper and lower insulating layers respectively, wherein the inner wiring layers and the outer wiring layers sandwiching the two upper and lower insulating layers respectively are electrically connected to each other via conductive bumps. Interlayer connection between the inner wiring layers and the outer wiring layers via the conductive bumps is suitable for still higher density mounting.

As yet another mode, the connecting member is one of solder and conductive resin. They are typical electrical/mechanical connecting members available.

As yet another mode, the connecting member is not in contact with a lateral-direction end portion of the conductive layer. That is, even when roughness is formed in the lateral-direction end portion of the conductive layer, the connecting member does not come in contact with this roughness, which can provide a manufacturing merit that the roughness does not interfere with the connecting member.

As yet another mode, the conductive layer has a horizontal cross section in a shape constituted of a plurality of arcs. This is suitable for the above-described mode where the connecting member is not in contact with the lateral-direction end portion of the conductive layer.

As a mode of the manufacturing method of the present invention, in producing the core wiring board having the conductive layers on at least the upper and lower surfaces thereof respectively, the core wiring board having four wiring layers is produced, the four wiring layers being electrically connected to one another via conductive bumps. Since the four wiring layers are provided, the core wiring board can have a thickness large enough to easily offer a space for housing the component, and the use of the conductive bumps for the interlayer connection between the wiring layers realizes still higher density mounting.

As another mode, forming the conductive layer so as to include the inner surface of the formed through hole includes: forming a conductive layer as a base by electroless plating; and forming a conductive layer as an upper layer by electrolytic plating, with the formed base being used as a seed. The use of such two-stage plating enables efficient plating.

As yet another mode, drilling is used in machining the produced core wiring board so as to split the conductive layer formed in the through hole according to the number of the terminals of the electrical/electronic component that is to be built in and so as make the space for housing the electrical/electronic component that is to be built in. The use of the drilling allows the use of an existing manufacturing device such as a drill for through holes.

As yet another mode, in placing the electrical/electronic component in the space, a supporting member is set at a bottom position of the core wiring board seen from the space and the electrical/electronic component is positioned on the supporting member. The assembly position of the component is the space formed in the core wiring board, and the use of such supporting member allows the use of an existing manufacturing device such as a widely used mounter.

As yet another mode, in connecting each of the terminals of the placed electrical/electronic component to the split conductive layer via the conductive member, one of solder and conductive resin is used as the conductive member. This is a typical electrical/mechanical connecting member available.

As a mode of the other manufacturing method of the present invention, forming the conductive layer so as to include the inner surface of the formed through hole includes: forming a conductive layer as a base by electroless plating; and forming a conductive layer as an upper layer by electrolytic plating, with the formed base being used as a seed. The use of such two-stage plating enables efficient plating.

As still another mode, one of drilling and die punching can be used in forming the through hole in the produced core wiring board so as to make the space for housing the electrical/electronic component that is to be built in. The use of the drilling allows the use of an existing manufacturing device such as a drill for through holes. The use of the die punching enables efficient forming of the through hole.

As yet another mode, in placing the electrical/electronic component in the space, a supporting member is set at a bottom position of the core wiring board seen from the space and the electrical/electronic component is positioned on the supporting member. The assembly position of the component is the space formed in the core wiring board, and the use of such supporting member allows the use of an existing manufacturing device such as a widely used mounter.

As yet another mode, in connecting each of the terminals of the placed electrical/electronic component to the split conductive layer via the conductive member, one of solder and conductive resin is used as the conductive member. This is a typical electrical/mechanical connecting member available.

As yet another mode, one of drilling, die punching, and laser machining is used in splitting the conductive layer formed in the through hole according to the number of the terminals of the electrical/electronic component that is to be built in.

As yet another mode, in producing the core wiring board having the conductive layers at least on the upper and lower surfaces thereof respectively, the core wiring board having four wiring layers can be manufactured, and the wiring layers can be electrically connected to one another via conductive bumps. Since the four wiring layers are provided, the core wiring board can have a thickness large enough to easily offer a space for housing the component, and the use of the conductive bumps for the interlayer connection between the wiring layers realizes still higher density mounting.

As yet another mode, in forming the through hole in the produced core wiring board so as to make the space for housing the electrical/electronic component that is to be built in, the through hole in a substantially circular shape can be formed.

As yet another mode, in forming the through hole in the produced core wiring board so as to make the space for housing the electrical/electronic component that is to be built in, the formed through hole can have a horizontal cross section whose outline is constituted of a plurality of arcs.

Figure 1B:
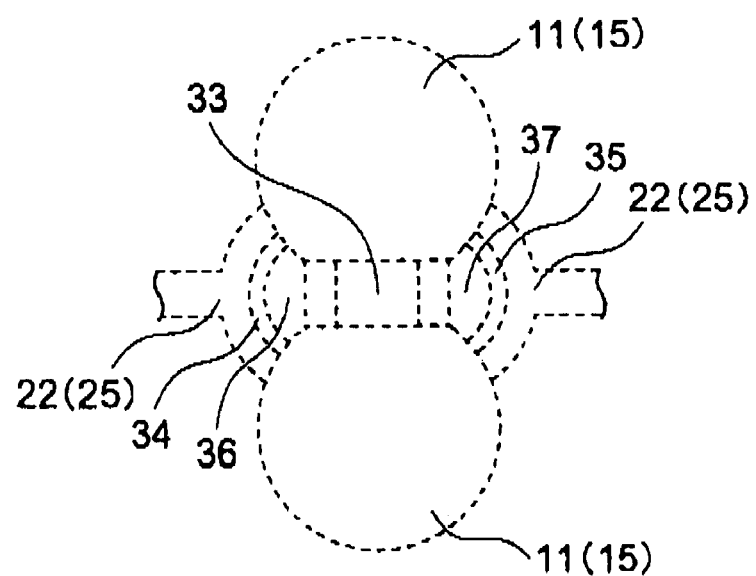

Based on the foregoing, embodiments of the present invention will be described below with reference to the drawings. FIG. 1A and FIG. 1B are a cross-sectional view (FIG. 1A) and a partial plan view (FIG. 1B) showing a schematic structure of a component built-in wiring board according to one embodiment of the present invention.

This embodiment is a six-layer wiring board having insulating layers 11 to 15 and wiring layers 21 to 26 provided in the vicinity of the boundaries of the insulating layers 11 to 15 and on an upper and a lower surface respectively, as shown in FIG. 1A. Conductive bumps 41 to 45 are provided for electrical connection between the adjacent wiring layers (interlayer connection), and these conductive bumps 41 to 45 can be laid one over another. The use of such conductive bumps 41 to 45 helps improve utilization efficiency of a major surface of the wiring board and is suitable for high density mounting. Note that the reference numerals 31, 32 on the upper and lower surfaces denote solder resists.

Further, an electrical/electronic component 33 (for example, a chip resistor here) is built in so as to be housed in a horizontal level range of the inner wiring layers 22, 23, 24, 25. Both terminals of the component 33 face and are electrically and mechanically connected to conductive layers 34, 35 extending in a board thickness direction, via solders 36, 37 as connecting members. The conductive layers 34, 35 are electrically connectable directly to the inner wiring layers 22, 23, 24, 25 as shown in the drawing.

The component 33 when seen from above is disposed as shown in FIG. 1B. Specifically, in the inner insulating layers 12, 13, 14, a through space is formed for housing the component 33 therein. The through space is occupied by the component 33, the solders 36, 37 for connection, and inwardly protruding portions of the upper and lower insulating layers 11, 15. Note that a thickness of the component 33 shown in FIG. 1A is generally smaller than a width thereof shown in FIG. 1B, but since a thickness direction of the wiring board is shown in an emphasized and enlarged manner in FIG. 1A, the thickness of the component 33 is also shown as being larger.

As for specific dimensions, when a 0603 chip resistor is used as the component 33, each of the insulating layers 12, 13, 14 is about 0.06 mm to about 0.1 mm in thickness so that the total thickness of the insulating layers 12, 13, 14 becomes, for example, about 0.2 mm to about 0.3 mm.

Examples of materials usable for the respective portions are: epoxy resin, polyimide resin, Bsmaleimide-Triazine resin, and the like for the insulating layers 11 to 15; copper and the like for the wiring layers 21 to 26 and the conductive layers 34, 35; and conductive resin with microscopic metal grains (silver, copper, gold, solder, or the like) dispersed therein and the like for the conductive bumps 41 to 45. Instead of the solders 36, 37, conductive resin is usable.

In the wiring board with the structure of this embodiment, the insulating layers 11, 15 cover and are in close contact with the periphery of the built-in component 33, which is extremely preferably for improving reliability since the occurrence of a void is prevented. Incidentally, in the above description, the chip resistor is taken as an example of the electrical/electronic component 33, but this embodiment is similarly applicable to a chip capacitor, a chip inductor, a chip diode, and the like whose arrangement structure of terminals is substantially the same as that of the chip resistor.

This embodiment is also applicable to a chip-type discrete transistor, a semiconductor device housed in a package, and the like having lead pins protruding in a horizontal direction from, for example, a middle of a thickness of mold resin which is a package, if a conductive layer extending in the thickness direction is formed on the wiring board side, being split according to the number of the lead pins. In a case of a bare semiconductor chip, by providing a projecting electrode on a pad as close as possible to its peripheral edge, this projecting electrode can be used for electrical and mechanical connection to the conductive layer on the wiring board side.

Figure 2A:
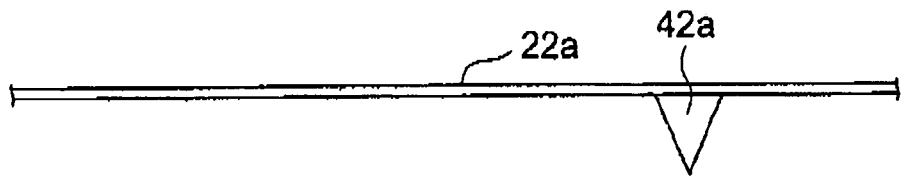
FIG. 2A, FIG. 2B, . . . , and FIG. 2F are cross-sectional views schematically showing processes of manufacturing the component built-in wiring board according to one embodiment of the present invention.
Figure 2B:
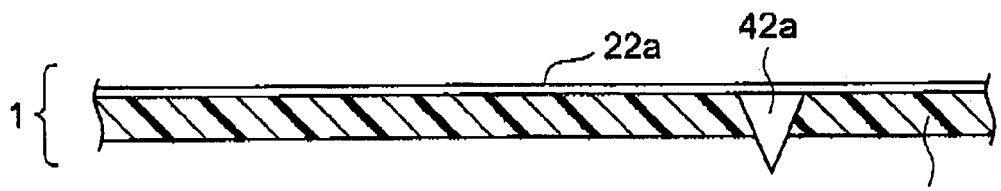

Next, an example of processes of manufacturing a component built-in wiring board as structured above will be described with reference to FIG. 2A, FIG. 2B, . . . , and FIG. 2F to FIG. 6A, FIG. 6B, and FIG. 6C. FIG. 2A, FIG. 2B, . . . , and FIG. 2F to FIG. 6A, FIG. 6B, and FIG. 6C are views schematically showing, in cross-sectional view (or partial plan view), processes of manufacturing the component built-in wiring board according to one embodiment of the present invention. In these drawings, the same or corresponding portions are denoted by the same reference codes. Further, portions corresponding to those of the wiring board shown in FIG. 1A and FIG. 1B are also denoted by the same reference codes.

Figure 2C:
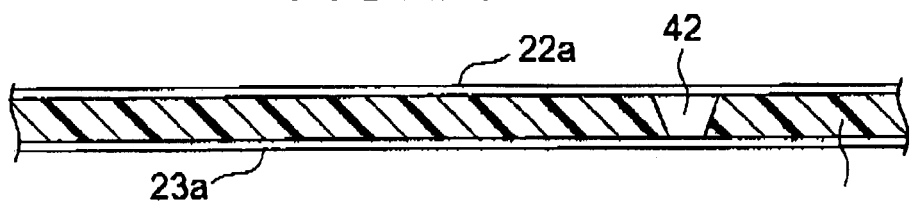
Figure 2D:
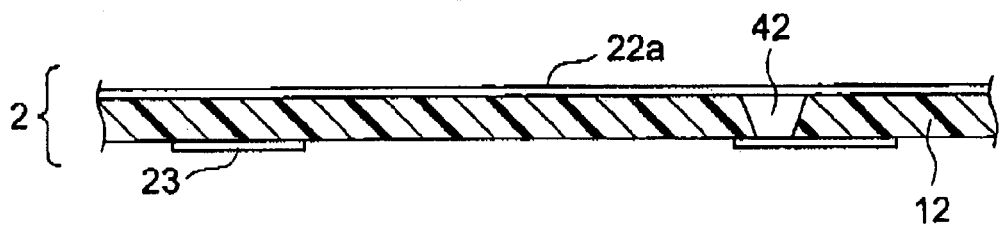
Figure 2E:
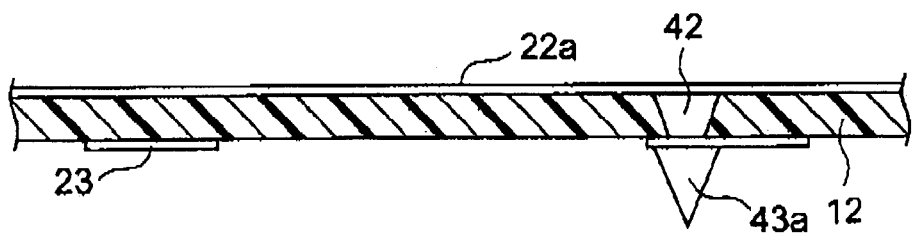
Figure 2F:
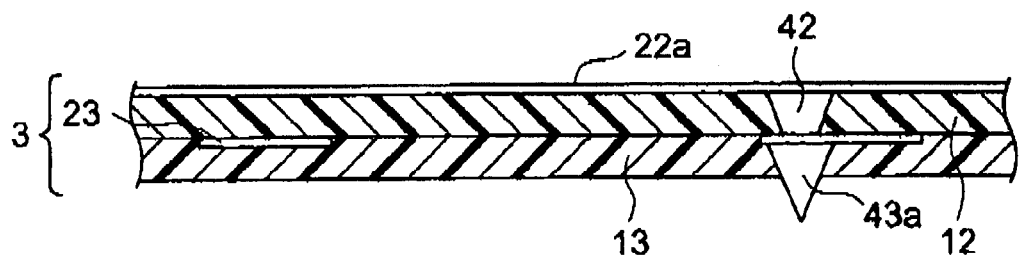

FIG. 2A, FIG. 2B, . . . , and FIG. 2F are cross-sectional views showing manufacturing processes of a core wiring board (a wiring board material including layers in which a component is to be built in) in the wiring board. First, as shown in FIG. 2A, a copper foil (for example, 18 μm in thickness) 22a is prepared, and a conductive bump 42a in a substantially conical shape is formed at a necessary position on the copper foil 22a (position conforming to the layout of a specific wiring board). For this process, for example, screen printing can be used to print conductive paste on the copper foil 22a.

A screen plate with a through hole (pit) of, for example, 0.2 mm is usable in this process. With this, a conductive bump having a bottom diameter of, for example, about 0.15 mm or larger can be formed. As the conductive paste, usable is, for example, paste resin such as epoxy resin with metal grains (silver, gold, copper, solder, or the like) dispersed therein and with a volatile solvent mixed therein. After the printing, the conductive paste is dried in, for example, an oven for curing.

Next, using a specialized machine, a pre-preg (for example, 0.06 mm in thickness) to be the insulating layer 12 is set to face the copper foil 22a, and the conductive bump 42a is penetrated through the semi-cured pre-preg, as shown in FIG. 2B. The pre-preg is made of, for example, a reinforcement such as a glass fiber impregnated with curable resin such as epoxy resin. The pre-preg before being cured is in a semi-cured state and has thermoplasticity (fluidity by heat) and a thermosetting property. The structure in the state shown in FIG. 2B will be later referred to as a wiring board material 1, 1a, or 1b (1a or 1b has the same structure).

Next, as shown in FIG. 2C, a copper foil (for example, 18 μm in thickness) 23a is laminated and integrated and the pre-preg is cured. For this process, a vacuum laminating/thermo-pressing machine is used, and this is set to a predetermined temperature and pressure profile. In laminating and integrating, a head of the conductive bump 42a is crushed to plastically deform (=to become a conductive bump 42), thereby establishing electrical connection to the copper foil 23a.

Next, as shown in FIG. 2D, the copper foil 23a on one side is subjected to circuit patterning to form a wiring layer 23. For this, for example, a surface of the copper foil 23a is first chemically polished to improve adhesion to a dry film for resist, and then the dry film for resist is laminated on the copper foil 23a. Then, the dry film is exposed by, for example, an aligner provided with an ultra-high pressure mercury lamp via a photomask, and is further spray-developed with sodium carbonate. The dry film with the resultant developed pattern is left on the copper foil 23a, so that a patterned resist is formed on the copper foil 23a.

After the resist is formed on the copper foil 23a, portions of the copper foil 23a corresponding to open portions of the resist pattern are spray-etched, using the resist as a mask and a ferric chloride-based chemical liquid as an etchant. Consequently, the wiring layer 23 is formed from the copper foil 23a. The formed wiring layer 23 is thereafter subjected to a blackening/reducing process in order to improve adhesion to an insulating layer to be stacked thereafter. The structure in the state shown in FIG. 2D will be later referred to as a wiring board material 2 or 2a (2a has the same structure).

Next, as shown in FIG. 2E, a conductive bump 43a in a substantially conical shape is formed at a necessary position (position conforming to the layout of a specific wiring board) on the wiring layer 23 that was formed by patterning. The conductive bump 43a can be formed in the same manner as that for forming the conductive bump 42a, by using a screen plate with a pit of, for example, 0.22 mm. Conductive paste formed by screen printing is dried in an oven for curing. Note that the conductive bump 43a and the conductive bump 42 can be laid one over the other via the wiring layer 23.

Next, using a specialized machine, a pre-preg (for example, 0.06 mm in thickness) to be the insulating layer 13 is set to face the insulating layer 12, and the conductive bump 43a is penetrated through the pre-preg in a semi-cured state, as shown in FIG. 2F. The same pre-preg as that of the insulating layer 12 can be used. Note that the structure in the state shown in FIG. 2F will be later referred to as a wiring board material 3.

FIG. 3A, FIG. 3B1, . . . , and FIG. 3C2 show manufacturing processes, in cross-sectional view or partial plan view, from a process of forming the core wiring board (the wiring board material including the layers in which the component is to be built in) by using the wiring board material 3 shown in FIG. 2F and the material 2a having the same structure as that of the wiring board material 2 shown in FIG. 2D up to the middle of a process of forming a through hole for housing the component in this core wiring board.

First, as shown in FIG. 3A, the wiring board material 3 and the wiring board material 2a are stacked and integrated, and the pre-preg to be the insulating layer 13 is cured. The wiring board material 2a has the same structure as that of the wiring board material 2 shown in FIG. 2D, and the conductive bump 44 is formed at a predetermined position and the wiring layer 24 is formed in a predetermined pattern (position/pattern conforming to the layout of a specific wiring board).

In stacking and integrating, the wiring board material 3 and the wiring board material 2a are positioned and stacked by, for example, a lay-up device, and a vacuum laminating/thermo-pressing machine is used to set this to a predetermined temperature and pressure profile. By this stacking/integrating, a head of the conductive bump 43a is crushed to plastically deform (=to become the conductive bump 43), thereby establishing electrical connection to the wiring layer 24. Further, owing the thermoplasticity (fluidity by heat) of the pre-preg to be the insulating film 13, the wiring layer 24 sink toward the insulating layer 13 side.

Through the above processes, the core wiring board is formed. In this embodiment, the core wiring board thus having the four wiring layers (or copper foils) 22a, 23, 24, 25a was formed, but the number of the wiring layers is not limited to four. For example, the number of the wiring layers may be even such as, for example, 2, 6, 8, . . . , or may be odd such as 3, 5, 7, . . . . The processes described above are also applicable for forming the core wiring board to a case where the number of the wiring layers is any of these numbers.

For example, the core wiring board with six wiring layers can be obtained by stacking and integrating the four-layer wiring board shown in FIG. 3A (with the copper foil on one side being patterned) and the wiring board material 3 shown in FIG. 2F. The core wiring board with three wiring layers can be obtained by using the wiring board material 3 shown in FIG. 2F instead of the wiring board material 1 shown in FIG. 2B and subjecting this structure to the process shown in FIG. 2C. Similarly, the core wiring board with other number of layers can be obtained by appropriate combination.

Further, in this embodiment, the conductive bumps 42a, 43a, 44a for interlayer connection need to have a height large enough to pass through the pre-pregs, and there is a certain extent of restriction on the height of the conductive bumps 42a, 43a, 44a, and therefore, in consideration of the thickness of the component to be built therein, there exists a preferable number as the number of the wiring layers of the core wiring board. The above-described wiring board is designed to house a chip resistor having 0603 or 1005 size, with the insulating layers 12, 13, 14 each being 0.06 mm in thickness, and with the total thickness thereof being about 0.2 mm. If the insulating layers 12, 13, 14 each have a thickness of 0.06 mm, the conductive bumps 42a, 43a, 44a with a bottom diameter of about 150 μm or larger is high enough to easily and fully penetrate the insulating layers 12, 13, 14. As a result, the number of the wiring layers was determined as four.

If the conductive bumps 42a, 43a, 44a are formed to be higher, they can penetrate thicker pre-pregs, and as a result, the number of the wiring layers of the core wiring board can be reduced even when the same component 33 is to be built therein. Conversely, when the conductive bumps 42a, 43a, 44a are formed to be shorter, thinner pre-pregs are used, so that the number of the wiring layers of the core wiring board can be increased.

Further, in this embodiment, the conductive bumps 42, 43, 44 serve for interlayer connection of the core wiring board, but this is not restrictive, and for example, well-known through holes may be used, though resulting in deterioration in high-density mountability as the wiring board.

Let us continue the description of the processes. After the core wiring board is formed, through holes 51 are next formed at necessary positions of the core wiring board as shown in FIGS. 3B1, B2. The through holes 51 serve as formation spaces of the conductive layers in a board thickness direction used for connection to the built-in component, and will constitute part of a space for housing the built-in component. Here, the two through holes 51 are formed for one built-in component so as to be substantially adjacent to each other, by using a 0.4 mm-diameter NC (numerical control) drill. When the holes are formed by the drill, the insides of the holes are cleaned by, for example, high pressure water cleaning or a desmear process using a predetermined chemical.

Next, as shown in FIGS. 3C1, C2, a plating layer 52 of, for example, copper with a thickness of, for example, 20 μm is formed so as to include inner wall surfaces of the through holes 51. The plating layer 52 can be formed in such a manner that, for example, a seed layer with a continuous surface is formed by electroless plating such as chemical copper plating, and with the formed seed layer being used as a seed, electrolytic plating is thereafter applied in, for example, copper sulfate bath. Such two-stage plating enables more efficient formation of the plating layer 52. The plating layer 52 formed in the through holes 51 are also electrically connectable to the wiring layers 23, 24 disposed in the middle of the core wiring board as shown in the drawings.

FIG. 4A1, FIG. 4A2, and FIG. 4B show, in cross-sectional view or partial plan view, the rest of the manufacturing processes of forming the through holes for housing the component in the core wiring board.

When the plating layer 52 is formed as shown in FIGS. 3C1, C2, the copper foils 22a, 25a on both surfaces, (and the plating layer 52 positioned on the both surfaces) are next patterned to form the wiring layers 22, 25. For this patterning, the same procedure can be used as that for the forming process of the wiring layer 23 which was described with reference to FIG. 2D. Specifically, the patterning follows the procedure of chemical polishing, laminating of a dry film for resist, exposure via a photomask, developing, and etching. The formed wiring layers 22, 25 include land portions (with a diameter of, for example, 0.8 mm) to the plating layer 52 formed on the inner wall surfaces of the through holes 51, as shown in FIG. 4A2.

Next, as shown in FIG. 4B, the core wiring board is machined so that the plating layer 52 on the inner wall surfaces of the through holes 51 are split and so that the conductive layers 34, 35 being connecting portions to the built-in component are independently formed. A machining method here is drilling using a NC drill. Specifically, two plating-layer splitting through holes 53 each with a diameter of 0.8 mm are formed to be substantially adjacent to each other, being arranged on the core wiring board in a direction perpendicular to a direction in which the through holes 51 are arranged. The plating layer 52 is thus split with the drill, and therefore, the conductive layers 34, 35 can be separately formed by using an existing device.

Forming the plating-layer splitting through holes 53 large here relative to the through holes 51 as shown in the drawing is advantageous in that the plating-layer splitting through holes 53 can function as a space for repairing the improper component assembly that might occur in a subsequent component mounting process.

It should be noted that the plating-layer splitting through holes 53 are not limited to the combination of the two holes as described above, but may be formed as one hole whose center is positioned right in the middle of the two through holes 51. This structure reduces the space for repairing but improves efficiency since only one hole need to be formed for splitting the plating layer.

Through the above-described processes, the core wiring board provided with the space for housing the component (the space made by the through holes 51 and the plating-layer splitting through holes 53) can be obtained. Incidentally, the plating layer 52 can be split by a method other than the drilling. For example, die punching or a method using a cutter is usable.

FIG. 5A, FIG. 5B1, and FIG. 5B2 show, in cross-sectional view or partial plan view, component mounting processes for incorporating the component inside the core wiring board. First, as shown in FIG. 5A, one-side surface of the core wiring board is placed on a supporting member 61, and in this state, the component 33 is placed at a predetermined position (the space for housing) by an assembly device such as a mounter. Here, more preferably, an adhesive layer 61a is provided on a surface of the supporting member 61. Owing to the adhesive layer 61a, the mounted component 33 can be in a certain degree of a fixed state when sent to a subsequent process.

Incidentally, instead of using the supporting member 61 having such an adhesive layer 61a, a heat-resistant adhesive tape (or a heat-resistant adhesive sheet) may be pasted on the one-side surface of the core wiring board.

Next, as shown in FIGS. 5B1, B2, cream solders 36a, 37a (zinc-free solders, for example, Sn-3.0 Ag-0.5 Cu) are applied on predetermined positions near both terminals of the component 33. They can be applied by, for example, screen printing or a dispenser. Here, screen printing using a screen plate having a pit with a 0.5 mm diameter is adopted. Incidentally, instead of the cream solders 36a, 37a, conductive paste may be used.

Figure 6A:
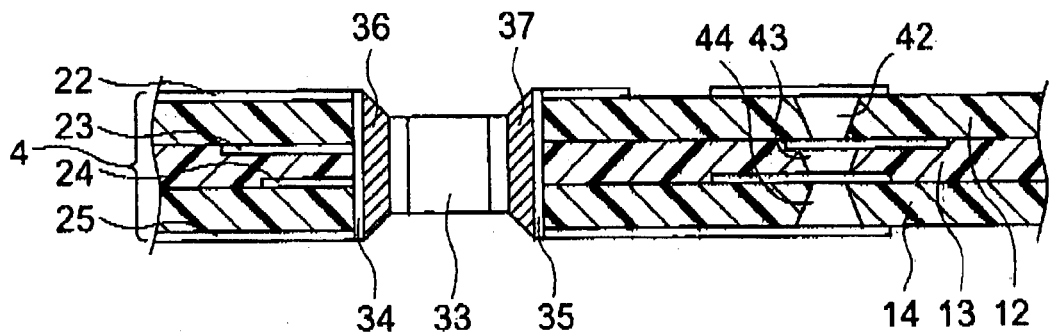
FIG. 6A, FIG. 6B, and FIG. 6C are views continuing from FIG. 5A, FIG. 5B1, and FIG. 5B2, schematically showing, in cross-sectional view, processes of manufacturing the component built-in wiring board according to the embodiment of the present invention.
Figure 6B:
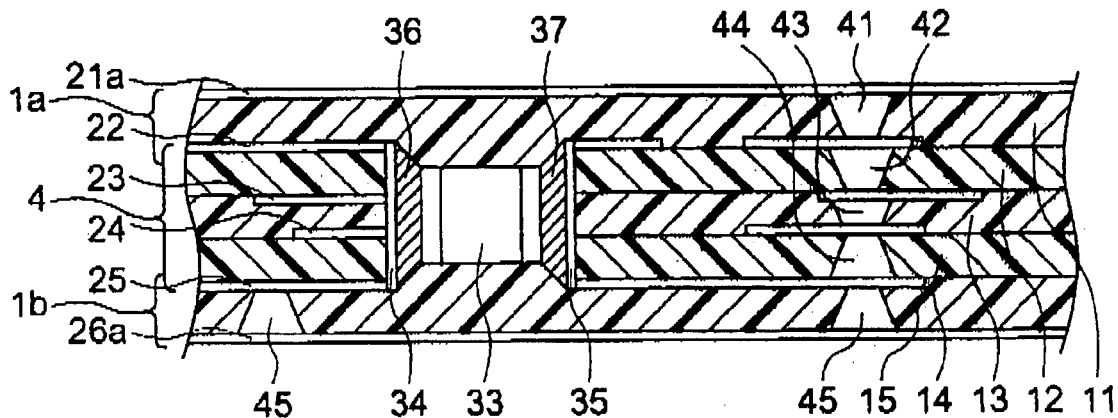
Figure 6C:
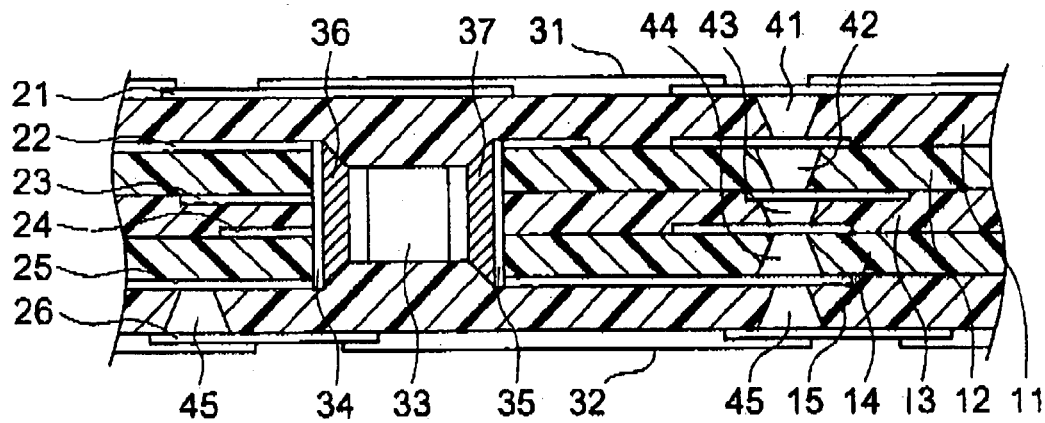

FIG. 6A, FIG. 6B, and FIG. 6C are cross-sectional views showing processes of forming the component built-in wiring board as a finished product, using the core wiring board in which the component is mounted. After the cream solders 36a, 37a are applied on the core wiring board as shown in FIGS. 5B1, B2, the cream solders 36a, 37a are next reflowed in a reflow furnace. This results in the state shown in FIG. 6A, and the solders 36, 37 as the connecting members establish electrical/mechanical connection between the conductive layers 34, 35 and the terminals of the component 33. Incidentally, when the conductive past is used instead of the cream solders 36a, 37a, the conductive past is dried in, for example, an oven for curing, thereby establishing the electrical/mechanical connection.

In the core wiring board 4 with the built-in component obtained through the above processes, the wiring layers 22, 25 on both surfaces thereof are subjected to a blackening/reducing process in order to improve adhesion to an insulating layer to be stacked thereafter.

Next, as shown in FIG. 6B, the wiring board materials 1a, 1b are stacked on both sides of the core wiring board 4 and they are integrated. At this time, pre-pregs to be the insulating layers 11, 15 are cured. The wiring board materials 1a, 1b have the same structure as that of the wiring board material 1 shown in FIG. 2B, and the conductive bump 41 or 45 is formed at a predetermined position (position conforming to the layout of a specific wiring board).

For stacking and integrating, for example, a lay-up device is used for positioning and stacking the core wiring board 4 and the wiring board materials 1a, 1b, and a vacuum laminating/thermo-pressing machine is used to set this to a predetermined temperature and pressure profile. By this stacking/integrating, heads of the conductive bumps 41, 45 are crushed to plastically deform, thereby establishing electrical connection to the wiring layer 22 or 25.

Further, owing thermoplasticity (fluidity by heat) of the pre-preg to become the insulating layer 11, the wiring layer 22 sinks toward the insulating layer 11 side, and owing to thermoplasticity (fluidity by heat) of the pre-preg to be the insulating layer 15, the wiring layer 25 sinks toward the insulating layer 15 side. Further, owing to thermoplasticity (fluidity by heat) of the pre-pregs to be the insulating layers 11, 15, an insulating layer integrated with the insulating layers 11, 15 is formed around the built-in component 33 to cover and be in close contact with the component 33. This eliminates a need for a process of filling the vicinity of the component 33, resulting in process simplification, and prevents the occurrence of a void, resulting in improved reliability.

Note that the wiring board material stacked on the outer side may have a larger number of wiring layers than that of the wiring board material shown in FIG. 2B. For example, it may have two wiring layers as shown in FIG. 2F, or similarly, three wiring layers or more. It is not essential that the wiring board material stacked on the outer side has the conductive bump 42a as shown in FIG. 2B. In this case, since the conductive bump 42a does not exist, interlayer connection between the copper foil 21a (26a) and the wiring layer 22 (25) cannot rely on the conductive bump, but if a through hole is provided in the wiring board after the stacking, this through hole can be used for the interlayer connection.

After an insulating layer to be positioned on the outer side and the core wiring board are stacked and integrated, the copper foils 21a, 25a on both outer sides are next patterned to form the wiring layers 21, 26 as shown in FIG. 6C. The patterning can follow the same procedure as that for forming the wiring layer 23 described with reference to FIG. 2D. Specifically, it follows the procedure of chemical polishing, laminating a dry film for resist, exposure via a photomask, developing, and etching. Incidentally, after the outer insulating layers 11, 15 are formed, another insulating layer may be stacked/integrated (built-up) on each of the outer sides in the same manner.

Next, as shown in FIG. 6C, the solder resists 31, 32 are formed at predetermined positions on the outermost surfaces. Further, for an anticorrosion purpose, a nickel/gold (nickel is for a base) layer (not shown) is formed by electroless plating on portions of the wiring layer 21 or 26 where no solder resist is formed. Then, the wiring board is cut out so as to have a predetermined outer shape by a router bit. Through the above processes, the component built-in wiring board according to this embodiment can be obtained.

In this embodiment, as manufacturing machines, existing machines can be used with substantially no modification, which leads to reduction in manufacturing cost of the wiring board. In addition, the conductive bump 41 to 45 which can be laid one over another are used for interlayer connection, which can shorten a wiring length to enable efficient layout as the wiring board with improved electrical characteristic. In particular, since chip resistors and chip capacitors which are mounted in relatively large number can be built in, current design rules can be relaxed and still higher density mounting is achieved.

Figure 7A:
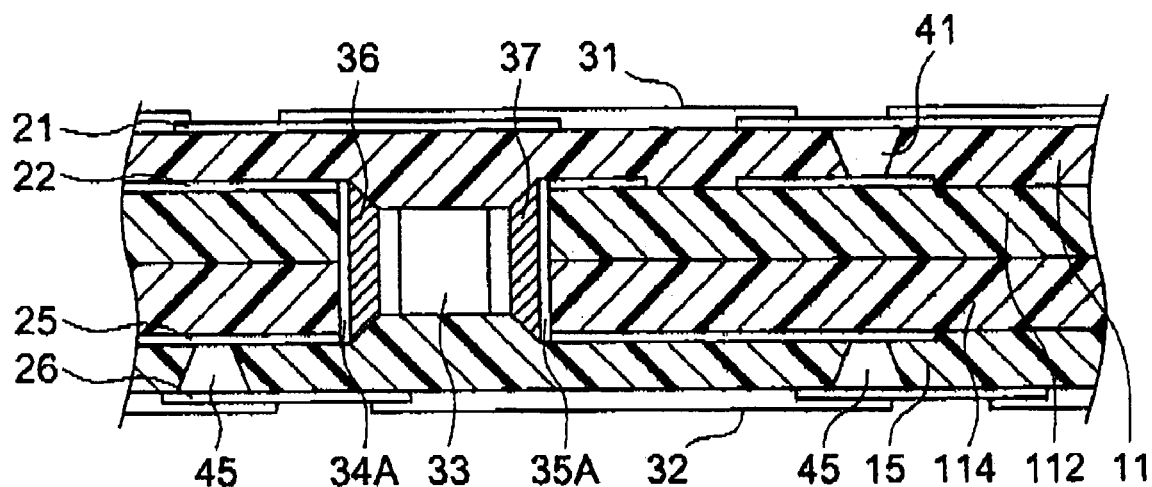
FIG. 7A and FIG. 7B are a cross-sectional view and a partial plan view showing a schematic structure of a component built-in wiring board according to another embodiment of the present invention.
Figure 7B:
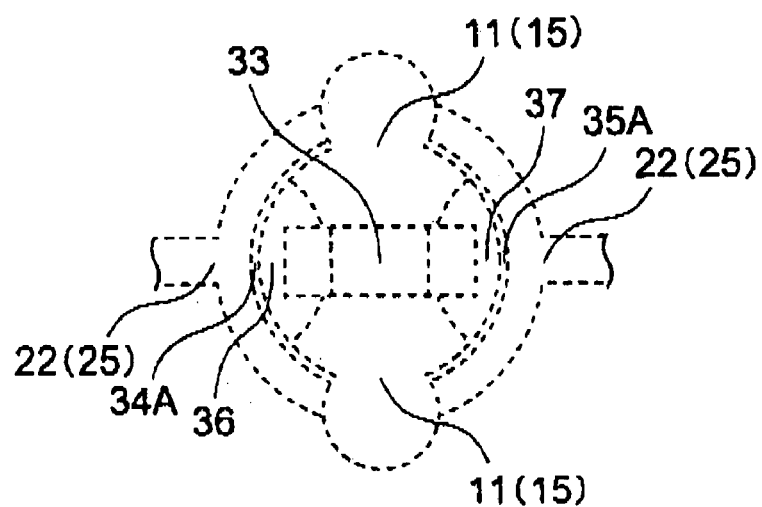

Next, a component built-in wiring board according to another embodiment of the present invention will be described with reference to FIG. 7A and FIG. 7B. FIG. 7A and FIG. 7B are a cross-sectional view (FIG. 7A) and a partial plan view (FIG. 7B) showing a schematic structure of the component built-in wiring board according to the other embodiment of the present invention.

This embodiment is a modification example of the component built-in wiring board according to the embodiment shown in FIG. 1A and FIG. 1B described above, and the shape of a through hole portion formed in a core wiring board is made different for smoother placement of an electrical/electronic component 33. What is further modified here is that the core wiring board has two wiring layers as an example instead of four wiring layers. In FIG. 7A and FIG. 7B, the same reference codes are used to designate the same or corresponding portions as those already described, and description thereof will be omitted as much as possible.

As shown in FIG. 7A, this component built-in wiring board is a four-layer wiring board that has insulating layers 11, 112, 114, 15 and wiring layers 21, 22, 25, 26 disposed near the boundary of the insulating layers 11, 112, near the boundary of the insulating layers 114, 15, and on an upper and a lower surface, respectively. Only conductive layers 34A, 35A extending in a vertical direction are shown as elements for interlayer connection between inner wiring layers 22, 23, but so-called blind vias or the like made of conductive compositions can be formed for this purpose.

The component 33 when seen from above is disposed as shown in FIG. 7B. Solders 36, 37 do not reach lateral-direction end portions of the conductive layers 34A, 35A (=Burrs ascribable to manufacturing processes may possibly occur. To be described later in detail). As the insulating layers 112, 114, a single layer may be used, but in this embodiment, two layers are stacked so as to have a predetermined thickness.

In the wiring board with the structure of this embodiment, similarly to that shown in FIG. 1A and FIG. 1B, the insulating layers 11, 15 cover and are in close contact with the periphery of the built-in component 33 to prevent the occurrence of a void, which is extremely preferable for improving reliability. In addition, the solders 36, 37 do not reach the lateral-direction end portions of the conductive layers 34A, 35A, which further facilitates a process of placing the component 33 and the solders 36, 37 (to be described in detail later).

An example of processes of manufacturing the component built-in wiring board as structured above will be described with reference to FIG. 8A, FIG. 8B1, . . . , and FIG. 8C2 to FIG. 12A, FIG. 12B, and FIG. 12C. FIG. 8A, FIG. 8B1, . . . , and FIG. 8C2 to FIG. 12A, FIG. 12B, and FIG. 12C schematically show, in cross-sectional view (or partial plan view), the processes of manufacturing the component built-in wiring board according to the other embodiment of the present invention. In these drawings, the same reference codes are used to designate the same or corresponding portions. Further, the same reference codes are also used to designate portions corresponding to those of the wiring board shown in FIG. 7A and FIG. 7B.

FIG. 8A, FIG. 8B1, . . . , and FIG. 8C2 show, in cross-sectional view or partial plan view, manufacturing processes up to the middle of a process of forming a through hole for housing the component in the core wiring board (a wiring board material including layers in which the component is to be built in). First, as shown in FIG. 8A, a two-side copper-clad board is prepared in which the insulating layers 112, 114 are stacked and copper foils (for example, 18 μm in thickness) 22a, 25a are disposed on the upper and lower surfaces. This will be the core wiring board.

When the core wiring board is prepared, a circular through hole 51A is next formed at a necessary position of the core wiring board as shown in FIGS. 8B1, B2. In the through hole 51A, the conductive layers extending in a board thickness direction is to be formed for connection to the built-in component, and the through hole 51A will be a space for housing the built-in component. Here, one through hole 51A is formed for each built-in component, using a 0.8 mm-diameter NC (numerical control) drill. After the hole is formed with the drill, the inside of the hole is cleaned by, for example, high-pressure water cleaning and a desmear process using a predetermined chemical. Incidentally, die punching can also be used for forming the through hole 51.

Next, as shown in FIGS. 8C1, C2, a plating layer 52 of, for example, copper with a thickness of, for example, 20 μm is formed so as to include an inner wall surface of the through hole 51A. This process is the same as that shown in FIGS. 3C1, C2.

Incidentally, the processes shown in FIG. 8A, FIG. 8B1, . . . , and FIG. 8C2 are described as the processes for forming the through hole 51A for housing the component, but this description is substantially the same as that for processes of forming interlayer connection by a so-called blind via. Specifically, when electrical connection between the wiring layers by the copper foils 22a, 25a is required, a hole similar to the through hole 51A (but with a smaller diameter) is formed and a plating layer is further formed on an inner wall surface thereof, so that interlayer connection can be established.

FIG. 9A1, FIG. 9A2, FIG. 9B1, and FIG. 9B2 show, in cross-sectional view or partial plan view, the rest of the manufacturing processes of forming the through hole for housing the component in the core wiring board.

After the plating layer 52 is formed as shown in FIGS. 8C1, C2, the copper foils 22a, 25a, (and the plating layer 52 positioned on the both surfaces) on the both surfaces are next patterned to form the wiring layers 22, 25 as shown in FIGS. 9A1, A2. This is the same as the description in FIGS. 4A1, A2. The formed wiring layers 22, 25 are subjected to a blackening/reducing process for higher adhesion to an insulating layer to be stacked thereafter (this process may be conducted at a stage in FIG. 12A to be described later). The formed wiring layers 22, 25 include land portions (for example, 1.2 mm in outside diameter) to the plating layer 52 formed on the inner wall surface of the through hole 51A, as shown in FIG. 9A2.

Next, as shown in FIG. 9B1, the core wiring board is machined so that the plating layer 52 on the inner wall surface of the through hole 51A is split and so that the conductive layers 34A, 35A being connecting portions to the built-in component are independently formed. A machining method here is drilling using a NC drill. Specifically, holes (plating-layer splitting through holes) 53A each with a smaller diameter (for example, 0.5 mm) than that of the through hole 51A are formed at positions on the outline of the through hole 51A facing each other. The plating layer 52 is split with such a drill, and therefore, the conductive layers 34, 35 can be separately formed with ease using an existing device.

Moreover, since the plating layer 52 is split by the holes 53A with a smaller diameter than the diameter of the through hole 51A, the lateral dimensions of the conductive layers 34A, 35A that are independently formed are relatively wide. Therefore, even when a burr 153 (mostly a residue of the peeled plating layer 52 that is not removed) ascribable to the formation of the hole 53A occurs in the boundary with the conductive layers 34A, 35A as shown in FIG. 9B2, this burr 153 is prevented from interfering with the placement of the built-in component. In other words, even if the burr 153 occurs, since a process of removing this is not specially needed, productivity can be improved (to be discussed also in FIG. 10B3). Incidentally, it is known that the burr 153 more easily occurs as a blade of a drill for forming the holes 53A is more worn out.

Through the above processes, it is possible to obtain the core wiring board in which the space (the space by the through hole 51A) for housing the component is formed. Incidentally, the plating layer 52 can be split by a method other than the drilling. For example, die punching, a method using a cutting machine or laser machining can be used.

FIG. 10A, FIG. 10B1, FIG. 10B2, and FIG. 10B3 show, in cross-sectional view or partial plan view, component mounting processes for placing the component in the core wiring board. First, as shown in FIG. 10A, one-side surface of the core wiring board is put on a supporting member 61, and in this state, the component 33 is placed at a predetermined position (the space for housing) by an assembly device such as a mounter. This process is the same as that shown in FIG. 5A.

Next, as shown in FIGS. 10B1, B2, cream solders 36a, 37a (zinc-free solders, for example, Sn-3.0 Ag-0.5 Cu) are applied on predetermined positions near both terminals of the component 33. This process is the same as that shown in FIG. 5B1.

Here, in mounting the component 33 and applying the cream solders 36a, 37a, even when there exists a burr 153 in a lateral-direction end portion of the conductive layer 34A (35A) for component connection as shown in FIG. 10B3, the burr 153 does not interfere with these processes. This is because a large lateral dimension is secured for the conductive layer 34A (35A) relative to the component 33, so that it is possible to mount the component 33 and apply the cream solders 36a, 37a, evading the position where the burr 153 exists.

Figure 11A:
FIG. 11A and FIG. 11B are cross-sectional views schematically showing a structure of a wiring board material necessary for manufacturing the component built-in wiring board according to the other embodiment of the present invention.
Figure 11B:
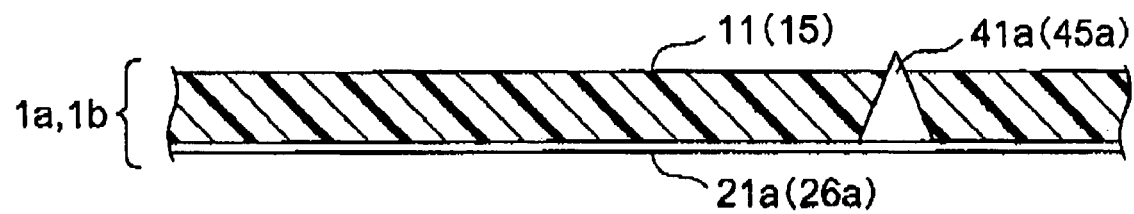

Next, a process of forming insulating layers and conductive layers to be stacked on both surfaces of the core wiring board in which the component is mounted will be described with reference to FIG. 11A and FIG. 11B, as a preparatory process of a subsequent process. FIG. 11A and FIG. 11B are cross-sectional views showing processes of forming a wiring board material to be stacked on the core wiring board. Such insulating layers and conductive layers are formed in advance as the wiring board materials.

The description on FIG. 11A and FIG. 11B is the same as the description on FIG. 2A and FIG. 2B respectively, though the reference codes are different. That is, by substituting the copper foil 22a for the copper foil 21a (26a), a conductive bump 42a for the conductive bump 41a (45a), and an insulating layer 12 for the insulating layer 11 (15), these descriptions become the same. The structure in the state shown in FIG. 11B will be later referred to as a wiring board material 1a or 1b.

Figure 12A:
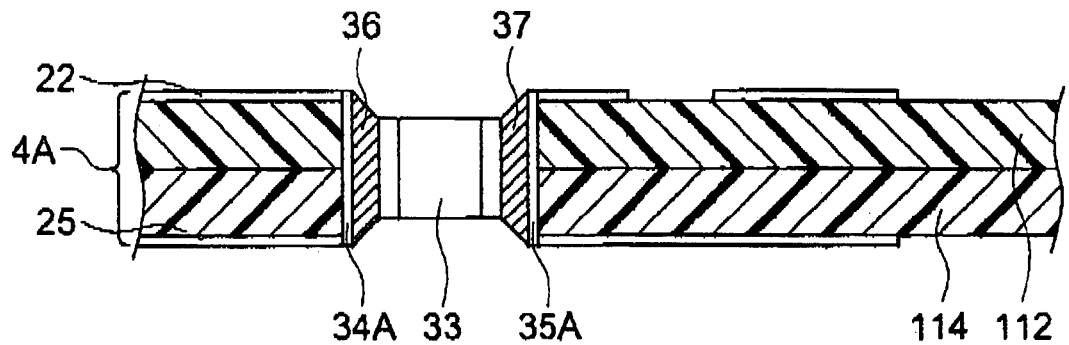
FIG. 12A, FIG. 12B, and FIG. 12C are views continuing from FIG. 10A, FIG. 10B1, FIG. 10B2, and FIG. 10B3, schematically showing, in cross-sectional view, processes of manufacturing the component built-in wiring board according to the other embodiment of the present invention.
Figure 12B:
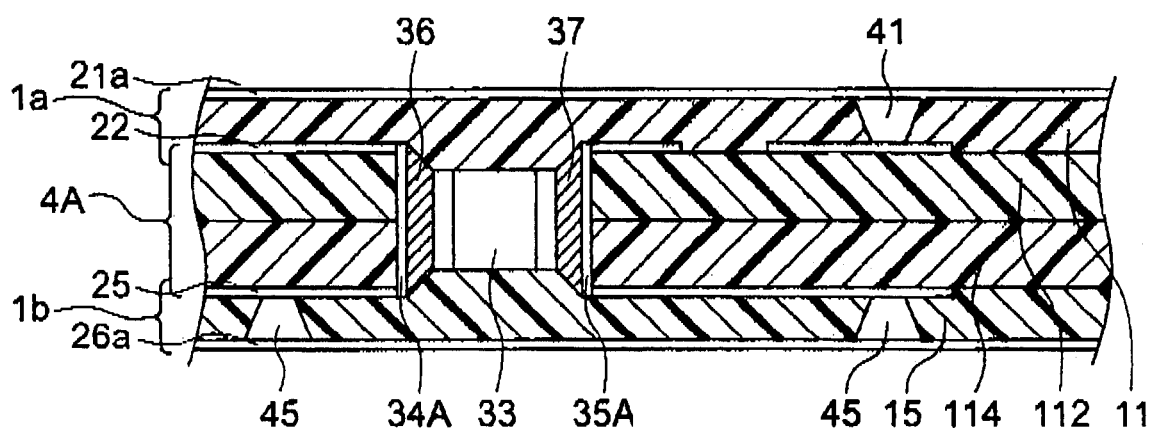
Figure 12C:
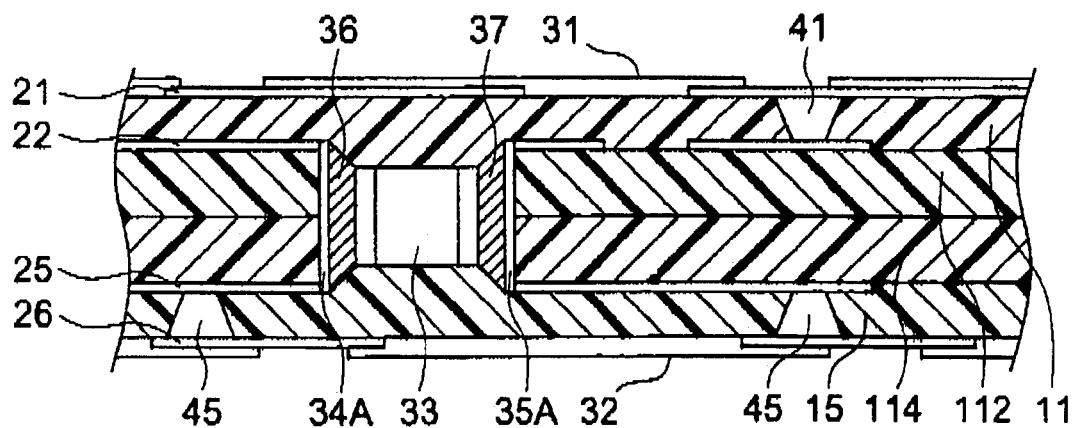

FIG. 12A, FIG. 12B, and FIG. 12C are cross-sectional views showing processes of forming the component built-in wiring board as a finished product, using the core wiring board in which the component is mounted. After the cream solders 36a, 37a are applied on the core wiring board as shown in FIGS. 10B1, B2, the cream solders 36a, 37a are next reflowed in a reflow furnace. Consequently, the state shown in FIG. 12A is obtained, and solders 36, 37 as connecting members establish electrical/mechanical connection between the conductive layers 34A, 35A and the terminals of the component 33. This is the same as the description of FIG. 6A.

Next, as shown in FIG. 12B, the wiring board materials 1a, 1b are stacked on both sides of a core wiring board 4A in which the component 33 is mounted and they are integrated. At this time, pre-pregs to be the insulating layers 11, 15 are cured. The wiring board materials 1a, 1b are obtained through the processes shown in FIG. 11A and FIG. 11B. The stacking and integrating in this process are the same as those in the description of FIG. 6B. This eliminates a need for a hole filling process of filling the vicinity of the component 33, resulting in process simplification, and prevents the occurrence of a void to enable improvement in reliability.

Incidentally, as the wiring board materials 1a, 1b stacked on the outer sides, those with a larger number of wiring layers may be used instead of that shown in FIG. 11B (for example, if a two-side copper-clad board which has been patterned is used instead of the copper foil 21a shown in FIG. 11A, the number of the wiring layers is two at the stage of FIG. 1B). In addition, it is not essential that the wiring board materials 1a, 1b stacked on the outer sides have the conductive bump 41a (45a) as shown in FIG. 11B. They are the same as the process shown in FIG. 6B.

When the insulating layers to be positioned on the outer sides are stacked on and integrated with the core wiring board 4, copper foils 21a, 26a on both outer sides are next patterned to form the wiring layers 21, 26 as shown in FIG. 12C. Further, layers of solder resists 31, 32 are formed at predetermined positions on the outermost surfaces. They are the same as those shown in FIG. 6C. Through the above processes, it is possible to obtain the component built-in wiring board according to this embodiment.

This embodiment is advantageous especially in that the solders 36, 37 do not reach the lateral-direction end portions of the conductive layers 34A, 35A, thus further facilitating the process of placing the component 33 and the solders 36, 37.

Incidentally, in the embodiment described above, the two-side copper-clad board in which the insulating layers 112, 114 are stacked is used as the material of the core wiring board 4A, but the four-layer wiring board similar to that in the embodiment described with reference to FIG. 1A to FIG. 6C may of course be used.

Figure 13A:
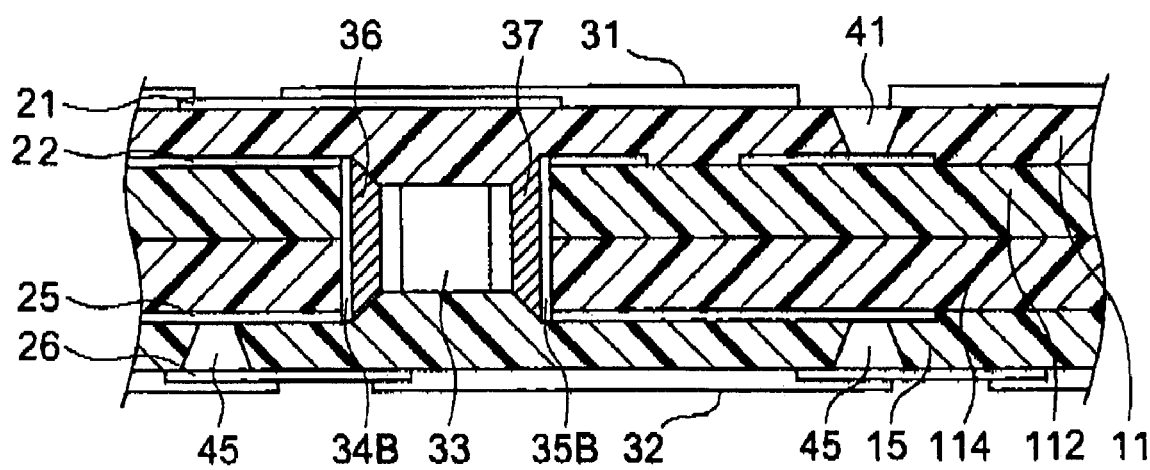
FIG. 13a and FIG. 13B are a cross-sectional view and a partial plan view showing a schematic structure of a component built-in wiring board according to still another embodiment of the present invention.
Figure 13B:
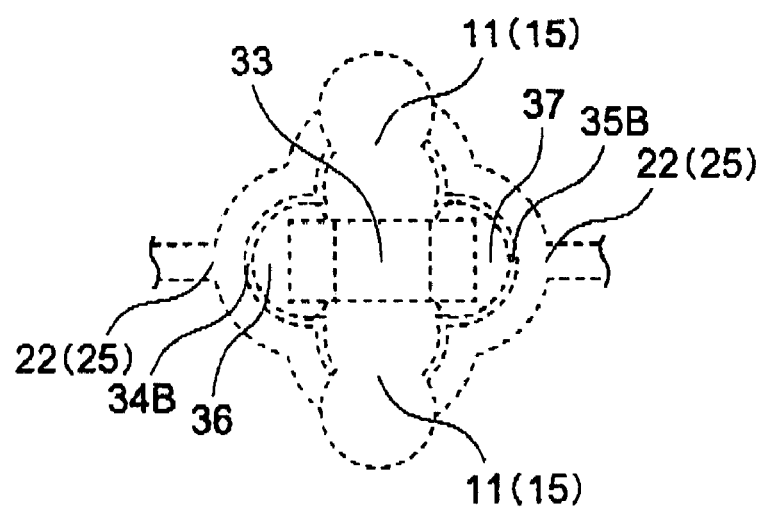

Next, a component built-in wiring board according to still another embodiment of the present invention will be described with reference to FIG. 13A and FIG. 13B. FIG. 13A and FIG. 13B are a cross-sectional view (FIG. 13A) and a partial plan view (FIG. 13B) showing a schematic structure of the component built-in wiring board according to the still other embodiment of the present invention.

This embodiment is also a modification example of the component built-in wiring board according to the embodiment shown in FIG. 1A and FIG. 1B described above, and the modification is made under the same concept as in the above embodiment described in FIG. 7A to FIG. 12C. What is further modified here is that a core wiring board has two wiring layers as an example instead of four wiring layers, similarly to the above. In FIG. 13A and FIG. 13B, the same reference codes are used to designate the same or corresponding portions as those already described, and description thereof will be omitted as much as possible.

A component 33 when seen from above is disposed as shown in FIG. 13B in this embodiment. Specifically, a through space whose horizontal section has an outline made by a plurality of arcs is formed in inner insulating layers 112, 114 in order to house the component 33, and this through space is occupied by the component 33, solders 36, 37 for connection, and inwardly protruding portions of insulating layers 11, 15 on top and bottom sides. Solders 36, 37 do not reach lateral-direction end portions of conductive layers 34B, 35B (=Burrs ascribable to manufacturing processes may possibly occur). This further facilitates a process of placing the component 33 and the solders 36, 37.

An example of processes of manufacturing the component built-in wiring board as structured above will be described with reference to FIG. 14A, FIG. 14B1, . . . , and FIG. 14C2 to FIG. 17A, FIG. 17B, and FIG. 17C. FIG. 14A, FIG. 14B1, . . . , and FIG. 14C2 to FIG. 17A, FIG. 17B, and FIG. 17C schematically show, in cross-sectional view (or partial plan view), the processes of manufacturing the component built-in wiring board according to the still other embodiment of the present invention. In these drawings, the same reference codes are used to designate the same or corresponding portions. Further, the same reference codes are also used to designate portions corresponding to those of the wiring board shown in FIG. 13A and FIG. 13B.

FIG. 14A, FIG. 14B1, . . . , and FIG. 14C2 show, in cross-sectional view or partial plan view, manufacturing processes up to the middle of a process of forming a through hole for housing the component in a core wiring board (a wiring board material including layers in which the component is to be incorporated). First, as shown in FIG. 14A, a two-side copper-clad board to be the core wiring board is prepared. This process is the same as that shown in FIG. 8A.

When the core wiring board is prepared, a through hole 51B whose outline (outline of a horizontal cross section) is made by the plural arcs is next formed at a necessary position of the core wiring board as shown in FIGS. 14B1, B2. In the through hole 51B, the conductive layers extending in a board thickness direction are to be formed for connection to the built-in component, and the through hole 51B will be a space for housing the built-in component. Here, for forming the through hole 51B, end portions (four places) of a cross of 0.3 mm by 0.3 mm are drilled, using a 0.5 mm-diameter NC (numerical control) drill (Consequently, the outline of the horizontal section of the through hole 51B is made by four arcs as shown in the drawing in this embodiment). After the hole is formed with the drill, the inside of the hole is cleaned by, for example, high-pressure water cleaning and a desmear process using a predetermined chemical. Incidentally, die punching can also be used for forming the through hole 51B.

Next, as shown in FIGS. 14C1, C2, a plating layer 52 of, for example, copper is formed with a thickness of, for example, 20 μm so as to include an inner wall surface of the through hole 51B. This process is the same as that shown in FIGS. 3C1, C2.

FIG. 15A1, FIG. 15A2, FIG. 15B1, and FIG. 15B2 show, in cross-sectional view or partial plan view, the rest of the manufacturing processes of forming the through hole for housing the component in the core wiring board.

After the plating layer 52 is formed as shown in FIGS. 14C1, C2, copper foils 22a, 25a, (and the plating layer 52 positioned on both surfaces) on the both surfaces are next patterned to form wiring layers 22, 25 as shown in FIGS. 15A1, A2. This is the same as the description in FIGS. 4A1, A2. The formed wiring layers 22, 25 are subjected to a blackening/reducing process for higher adhesion to an insulating layer to be thereafter stacked (this process may be conduced at a stage in FIG. 17A to be described later). The formed wiring layers 22, 25 include land portions (for example, 0.2 mm in width) to the plating layer 52 formed on the inner wall surface of the through hole 51B as shown in FIG. 15A2.

Next, as shown in FIG. 15B1, the core wiring board is machined so that the plating layer 52 on the inner wall surface of the through hole 51B is split and so that the conductive layers 34B, 35B being connecting portions to the built-in component are independently formed. A machining method here is drilling using a NC drill. Specifically, holes (plating-layer splitting through holes) 53B each with a diameter of, for example, about 0.4 mm to about 0.5 mm are formed at positions of the through hole 51B facing each other and overlapping the-outer contour of the through hole 51B. The plating layer 52 is split with such a drill, and therefore, the conductive layers 34, 35 can be separately formed with ease using an existing device.

Here, each of the plating-layer splitting through holes 53B has a diameter about a half of the maximum width of the entire through hole 51B, so that the lateral dimension of the conductive layers 34B, 35B that are formed independently has an allowance for the width of the component to be mounted therein. By such setting, even when a burr 153 (mostly a residue of the peeled plating layer 52 that is not removed) ascribable to the formation of the holes 53B occurs in the boundary with the conductive layers 34A, 35A as shown in FIG. 15B2, this burr 153 is prevented from interfering with the placement of the built-in component. In other words, even if the burr 153 occurs, since a process of removing this is not specially needed, productivity can be improved.

Through the above processes, it is possible to obtain the core wiring board in which the space (the space by the through hole 51A) for housing the component is formed.

FIG. 16A, FIG. 16B1, FIG. 16B2, and FIG. 16B3 show, in cross-sectional view or partial plan view, component mounting processes of mounting the component in the core wiring board. First, as shown in FIG. 16A, one-side surface of the core wiring board is put on a supporting member 61, and in this state, the component 33 is placed at a predetermined position (the space for housing) by an assembly device such as a mounter. This process is the same as that shown in FIG. 5A.

Next, as shown in FIGS. 10B1, B2, cream solders 36a, 37a (zinc-free solders, for example, Sn-3.0 Ag-0.5 Cu) are applied on predetermined positions near both terminals of the component 33. This process is the same as that shown in FIG. 5B1.

Here, even when a burr 153 occurs in a lateral-direction end portion of the conductive layer 34B (35B) for component connection as shown in FIG. 16B3, the burr 153 does not interfere with the processes of mounting the component 33 and applying the cream solders 36a, 37a. This is because a large lateral dimension is secured for the conductive layer 34B (35B) relative to the component 33, so that it is possible to mount the component 33 and apply the cream solders 36a, 37a, evading the position where the burr 153 exists. From this viewpoint, the through hole 51B formed in advance for housing the component 33 may be formed so as to have a horizontal cross section whose outline is made by a larger number of arcs, not limited to four arcs.

Figure 17A:
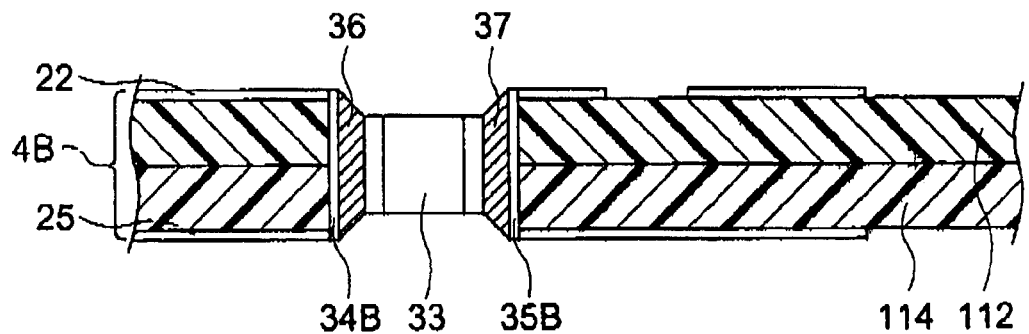
FIG. 17A, FIG. 17B, and FIG. 17C are views continuing from FIG. 16A, FIG. 16B1, FIG. 16B2, and FIG. 16B3, schematically showing, in cross-sectional view, processes of manufacturing the component built-in wiring board according to the still other embodiment of the present invention.
Figure 17B:
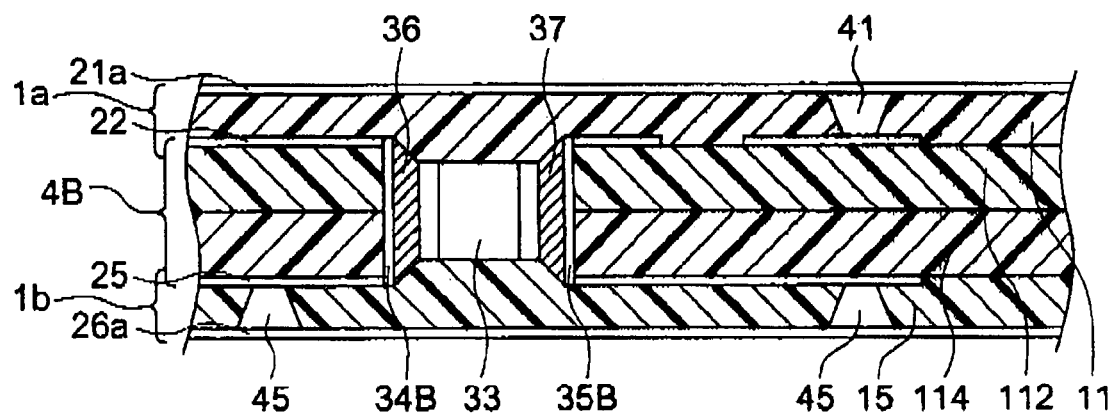
Figure 17C:
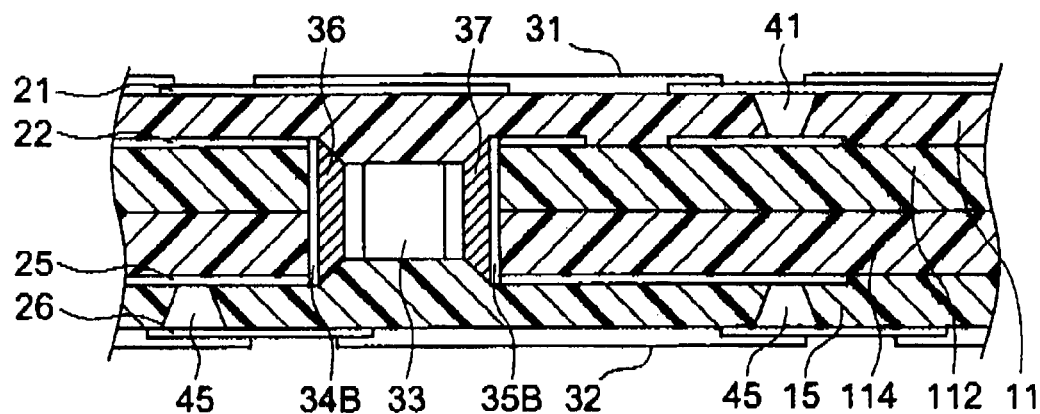

FIG. 17A, FIG. 17B, and FIG. 17C are cross-sectional views showing processes of forming the component built-in wiring board as a finished product, using the core wiring board in which the component is mounted. After the cream solders 36a, 37a are applied on the core wiring board as shown in FIGS. 16B1, B2, the cream solders 36a, 37a are next reflowed in a reflow furnace. Consequently, the state shown in FIG. 17A is obtained, and solders 36, 37 as connecting members establish electrical/mechanical connection between the conductive layers 34B, 35B and the terminals of the component 33. This is the same as the description of FIG. 6A.

Next, as shown in FIG. 17B, wiring board materials 1a, 1b (see FIG. 11A and FIG. 11B) are stacked on both sides of a core wiring board 4B and they are integrated. At this time, pre-pregs to be the insulating layers 11, 15 are cured. The process of stacking and integrating is the same as that in the description of FIG. 6B. This eliminates a need for a hole filling process of filling the vicinity of the component 33, resulting in process simplification, and prevents the occurrence of a void to enable improvement in reliability.

When the insulating layers to be positioned on the outer sides are stacked on and integrated with the core wiring board 4B, copper foils 21a, 26a on both outer sides are next patterned to form wiring layers 21, 26 as shown in FIG. 17C. Further, layers of solder resists 31, 32 are formed at predetermined positions on the outermost surfaces. They are the same as those shown in FIG. 6C. Through the above processes, it is possible to obtain the component built-in wiring board according to this embodiment.

This embodiment is also advantageous especially in that the solders 36, 37 do not reach the lateral-direction end portions of the conductive layers 34B, 35B, thus further facilitating the process of placing the component 33 and the solders 36, 37.

INDUSTRIAL APPLICABILITY

The component built-in wiring board according to the present invention can be manufactured in the manufacturing industry of component mounting boards, and is usable in the manufacturing industry of electronic equipment in general. The manufacturing method of the component built-in wiring board according to the present invention is usable in the manufacturing industry of component mounting boards. Therefore, both have industrial applicability.

What is claimed is:

1. A component built-in wiring board, comprising:
    a conductive layer extending in a thickness direction of the board and buried in the board without being exposed from an upper and a lower surface of the board;
    an electrical/electronic component having a terminal and buried in the board with the terminal facing the buried conductive layer;
    a connecting member provided in a gap between the terminal of the buried electrical/electronic component and the conductive layer to electrically/mechanically connect the terminal and the conductive layer; and
    two upper and lower insulating layers which cover an outer surface of the buried electrical/electronic component excluding a portion connected to the connecting member and which are in close contact with a top and a bottom in the board thickness direction of the electrical/electronic component;
    wherein the connecting member is not in contact with a lateral-direction end portion of the conductive layer.

2. A component built-in wiring board, comprising:
    a conductive layer extending in a thickness direction of the board and buried in the board without being exposed from an upper and a lower surface of the board;

an electrical/electronic component having a terminal and buried in the board with the terminal facing the buried conductive layer;

a connecting member provided in a gap between the terminal of the buried electrical/electronic component and the conductive layer to electrically/mechanically connect the terminal and the conductive layer; and two upper and lower insulating layers which cover an outer surface of the buried electrical/electronic component excluding a portion connected to the connecting member and which are in close contact with a top and a bottom in the board thickness direction of the electrical/electronic component;

wherein the conductive layer has a horizontal cross section in a shape constituted of a plurality of arcs.

* * * * *